(12) United States Patent
Chang et al.

(10) Patent No.: US 8,970,551 B2
(45) Date of Patent: *Mar. 3, 2015

(54) METHOD AND DEVICE FOR POSITION DETECTION

(71) Applicant: Egalax_Empia Technology Inc., Taipei (TW)

(72) Inventors: Chin-Fu Chang, Taipei (TW); Cheng-Han Lee, Taipei (TW); Chi-Hao Tang, Taipei (TW); Shun-Lung Ho, Taipei (TW)

(73) Assignee: Egalax_Empia Technology Inc., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/030,418

(22) Filed: Sep. 18, 2013

(65) Prior Publication Data

US 2014/0015798 A1    Jan. 16, 2014

Related U.S. Application Data

(63) Continuation of application No. 13/239,959, filed on Sep. 22, 2011, now Pat. No. 8,564,564, which is a continuation of application No. 12/923,808, filed on Oct. 8, 2010, now Pat. No. 8,570,289.

(Continued)

(51) Int. Cl.
G06F 3/045    (2006.01)
G01R 27/26    (2006.01)
(Continued)

(52) U.S. Cl.
CPC .......... *G01R 27/2605* (2013.01); *G06F 3/0416* (2013.01); *G06F 3/044* (2013.01);
(Continued)

(58) Field of Classification Search
CPC ................................ G06F 3/041; G06F 3/044
USPC .................... 345/156–174; 178/18.01–18.06; 324/658; 463/16, 20, 25
See application file for complete search history.

(56) References Cited

U.S. PATENT DOCUMENTS

| | | | |
|---|---|---|---|
| 4,639,720 | A | 1/1987 | Rympalski et al. |
| 5,374,787 | A | 12/1994 | Miller et al. |

(Continued)

FOREIGN PATENT DOCUMENTS

| | | |
|---|---|---|
| CN | 1164286 | 11/1997 |
| CN | 1596412 | 3/2005 |

(Continued)

*Primary Examiner* — Ricardo L Osorio
(74) *Attorney, Agent, or Firm* — WPAT, PC; Justin King

(57) ABSTRACT

A method and device for position detection are disclosed. A self-capacitance detection can be performed by a sensing device. According to the result of the self-capacitance detection, a first mutual-capacitance detection can be performed for determining one or more first 1-D positions. According to the result of the first mutual-capacitance detection, a second mutual-capacitance detection can be performed for determining one or more second 1-D positions corresponding to each first 1-D position. One or more 2-D positions can be provided according to the one or more second 1-D positions corresponding to each first 1-D position. Besides, during the self-capacitance detection, the first mutual-capacitance detection, and the second mutual-capacitance detection, a touch related sensing information corresponding to a touch that covers a wide area can be neglected for palm rejection.

16 Claims, 21 Drawing Sheets

Related U.S. Application Data

(60) Provisional application No. 61/298,252, filed on Jan. 26, 2010, provisional application No. 61/298,243, filed on Jan. 26, 2010, provisional application No. 61/250,051, filed on Oct. 9, 2009.

(51) Int. Cl.
*G06F 3/041* (2006.01)
*G06F 3/044* (2006.01)
*G06F 3/047* (2006.01)

(52) U.S. Cl.
CPC ............. *G06F 3/0418* (2013.01); *G06F 3/047* (2013.01); *G06F 2203/04103* (2013.01); *G06F 2203/04104* (2013.01); *G06F 2203/04111* (2013.01)
USPC .......................................... 345/174; 345/173

(56) References Cited

U.S. PATENT DOCUMENTS

| | | |
|---|---|---|
| 5,412,200 A | 5/1995 | Rhoads |
| 5,543,588 A | 8/1996 | Bisset et al. |
| 5,644,512 A | 7/1997 | Chernoff et al. |
| 5,825,670 A | 10/1998 | Chernoff et al. |
| 5,861,583 A | 1/1999 | Schediwy et al. |
| 6,075,520 A | 6/2000 | Inoue et al. |
| 6,150,809 A | 11/2000 | Tiernan et al. |
| 6,723,929 B2 | 4/2004 | Kent |
| 6,781,577 B2 | 8/2004 | Shigetaka |
| 7,072,778 B2 | 7/2006 | Swanson |
| 7,167,773 B2 | 1/2007 | Schneider et al. |
| 7,315,793 B2 | 1/2008 | Jean |
| 7,339,580 B2 | 3/2008 | Westerman et al. |
| 7,663,607 B2 | 2/2010 | Hotelling et al. |
| 7,728,816 B2 | 6/2010 | Xu et al. |
| 8,089,470 B1 | 1/2012 | Schediwy et al. |
| 8,102,376 B2 | 1/2012 | Lii et al. |
| 8,169,421 B2 | 5/2012 | Wright et al. |
| 8,212,782 B2 | 7/2012 | Cho et al. |
| 8,570,052 B1 * | 10/2013 | Mahartya ..................... 324/658 |
| 8,692,563 B1 * | 4/2014 | Maharyta ..................... 324/658 |
| 2005/0173820 A1 | 8/2005 | Schneider et al. |
| 2006/0071674 A1 | 4/2006 | Jean |
| 2006/0244735 A1 | 11/2006 | Wilson |
| 2007/0229466 A1 | 10/2007 | Peng et al. |
| 2007/0273574 A1 | 11/2007 | Barnum |
| 2008/0048990 A1 | 2/2008 | Cho et al. |
| 2008/0143681 A1 | 6/2008 | XiaoPing |
| 2008/0147350 A1 | 6/2008 | Jean |
| 2008/0158175 A1 | 7/2008 | Hotelling et al. |
| 2008/0158185 A1 | 7/2008 | Westerman |
| 2008/0180404 A1 | 7/2008 | Han et al. |
| 2008/0196945 A1 | 8/2008 | Konstas |
| 2008/0309634 A1 | 12/2008 | Hotelling et al. |
| 2009/0066669 A1 | 3/2009 | Olson |
| 2009/0085894 A1 | 4/2009 | Gandhi et al. |
| 2009/0174675 A1 | 7/2009 | Gillespie et al. |
| 2009/0211817 A1 | 8/2009 | Chang et al. |
| 2009/0273571 A1 | 11/2009 | Bowens |
| 2010/0026656 A1 | 2/2010 | Hotelling et al. |
| 2010/0079405 A1 | 4/2010 | Bernstein |
| 2010/0156852 A1 | 6/2010 | Chu et al. |
| 2010/0283785 A1 | 11/2010 | Satulovsky |
| 2012/0043141 A1 | 2/2012 | Xiaoping |
| 2012/0044150 A1 | 2/2012 | Karpin et al. |

FOREIGN PATENT DOCUMENTS

| | | |
|---|---|---|
| CN | 1720498 | 1/2006 |
| CN | 1811680 | 8/2006 |
| CN | 1845045 | 10/2006 |
| CN | 1885251 | 12/2006 |
| CN | 1942853 | 4/2007 |
| CN | 101059741 | 10/2007 |
| CN | 101105733 | 1/2008 |
| CN | 100419657 | 9/2008 |
| CN | 101261553 | 9/2008 |
| CN | 201156246 | 11/2008 |
| CN | 201181467 | 1/2009 |
| CN | 101369200 | 2/2009 |
| CN | 101452360 | 6/2009 |
| CN | 101470556 | 7/2009 |
| CN | 101526871 | 9/2009 |
| CN | 101539832 | 9/2009 |
| CN | 102023768 | 4/2011 |
| EP | 1191430 | 3/2002 |
| EP | 1630652 | 3/2006 |
| TW | 200401222 | 1/2004 |
| WO | 2008083362 | 7/2008 |
| WO | 2009007704 | 1/2009 |

\* cited by examiner

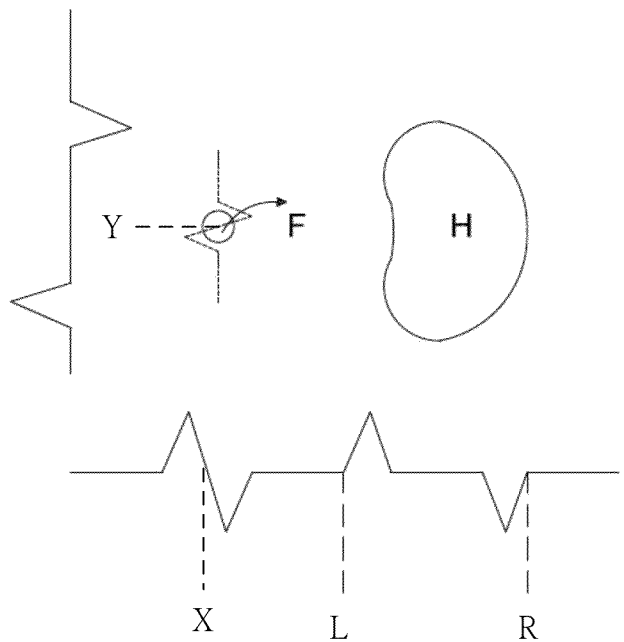

FIG. 6C

```
┌─────────────────────────────────────────────────────────┐
│ PROVIDING SENSING DEVICE WITH SENSORS INCLUDING         │
│       FIRST SENSORS AND SECOND SENSORS.                 │
│                       710                               │
└─────────────────────────────────────────────────────────┘
                            │
                            ▼
┌─────────────────────────────────────────────────────────┐
│ DETERMINING FIRST 1-D POSITION CORRESPONDING TO         │
│    EXTERNAL TOUCH BASED ON SIGNALS OF FIRST             │
│    SENSORS BY SELF-CAPACITANCE DETECTION.               │
│                       720                               │
└─────────────────────────────────────────────────────────┘
                            │
                            ▼
┌─────────────────────────────────────────────────────────┐
│ DETERMINING SECOND 1-D POSITION CORRESPONDING           │
│ TO FIRST 1-D POSITION BASED ON SIGNALS OF SECOND        │
│   SENSORS BY MUTUAL-CAPACITANCE DETECTION.              │
│                       730                               │
└─────────────────────────────────────────────────────────┘
```

FIG. 7A

METHOD AND DEVICE FOR POSITION DETECTION

CROSS REFERENCE TO RELATED APPLICATIONS

This application is a continuation of U.S. patent application Ser. No. 13/239,959, filed Sep. 22, 2011, which claims priority of U.S. patent application Ser. No. 12/923,808, filed Oct. 8, 2010, which then claims the benefit of U.S. provisional application No. 61/298,252, filed on Jan. 26, 2010, provisional application No. 61/298,243, filed on Jan. 26, 2010 and U.S. provisional application No. 61/250,051, filed on Oct. 9, 2009, which are herein incorporated by reference for all intents and purposes.

BACKGROUND OF THE INVENTION

1. Field of the Invention

The present invention relates to a method and device for position detection, and more particularly, to a method and device for position detection using mutual-capacitance detection in combination with self-capacitance detection.

2. Description of the Prior Art

Touch displays have been widely used in the various electronic devices. One approach is to employ a touch sensitive panel to define a 2-D touch area on the touch display, where sensing information is obtained by scanning along horizontal and vertical axes of the touch panel for determining the touch or proximity of an external object (e.g. a finger) on or near the touch panel. U.S. Pat. No. 4,639,720 discloses a capacitive touch display.

Sensing information can be converted into a plurality of continuous signal values by an analog-to-digital converter (ADC). By comparing signal values before and after the touch or approaching of the external object, the location touched or approached by the external object can be determined.

Generally, a controller controlling the touch panel will first obtain sensing information when there is no external object touching or approaching as a baseline. For example, in a capacitive touch panel, each conductive line corresponds to a respective baseline. The controller determines whether there is an external object touching or approaching by comparing sensing information obtained subsequently with the baseline, and further determines the position of the external object. For example, when there is no external object touching or approaching the touch panel, subsequent sensing information with respect to the baseline will be or close to zero. Thus, the controller can determine whether there is an external object touching or approaching by determining whether the sensing information with respect to the baseline is or close to zero.

As shown in FIG. 1A, when an external object 12 (e.g. a finger) touches or approaches a sensing device 120 of a touch display 10, sensing information of sensors 140 on an axis (e.g. x axis) is converted into signal values as shown in FIG. 1B. Corresponding to the appearance of the finger, the signal values show a waveform or finger profile. The location of the peak 14 of the finger profile indicates the position touched or approached by the finger.

Since sensors on a touch panel are not densely disposed, i.e. there are gaps between the sensors, as shown in FIG. 5A (in a single dimension, for example). Thus, when a finger touches a fourth sensor on the touch panel, a corresponding touch related sensing information is detected (solid line). Meanwhile, the signal value detected by the fourth sensor is the maximum value, which is also the peak of this touch related sensing information.

Thereafter, when the finger gradually moves to the right, it will press against a position without any disposed sensor, e.g. between the fourth and fifth sensors. The touch related sensing information detected now is as shown by the dotted line. The peak of the touch related sensing information cannot be directly detected by the sensors, but position detection is required to calculate the position of the waveform peak. Since the sensors are not densely disposed, when a finger moves on a touch panel in a constant velocity in a certain dimension (X or Y direction), the touch panel displays the path of the moving finger in a non-constant velocity.

From the above it is clear that prior art still has shortcomings. In order to solve these problems, efforts have long been made in vain, while ordinary products and methods offering no appropriate structures and methods. Thus, there is a need in the industry for a novel technique that solves these problems.

SUMMARY OF THE INVENTION

The present invention provides a method and device for position detection. A self-capacitance detection can be performed by a sensing device. According to the result of the self-capacitance detection, a first mutual-capacitance detection can be performed for determining one or more first 1-D positions. According to the result of the first mutual-capacitance detection, a second mutual-capacitance detection can be performed for determining one or more second 1-D positions corresponding to each first 1-D position. One or more 2-D positions can be provided according to the one or more second 1-D positions corresponding to each first 1-D position. Besides, during the self-capacitance detection, the first mutual-capacitance detection, and the second mutual-capacitance detection, a touch related sensing information corresponding to a touch that covers a wide area can be neglected for palm rejection.

As mentioned before, since the sensors are not densely disposed, when a finger moves on a touch panel in a constant velocity in a certain dimension (X or Y direction), the touch panel displays the path of the moving finger in a non-constant velocity.

The present invention includes the following objectives:

1. mutual-capacitance detection is performed based on the result of self-capacitance detection to reduce misjudgments due to close touch positions;

2. mutual-capacitance detection is performed again based on the mutual-capacitance detection to detect a more accurate position; and 3. detection of input by a pen held by fingers with palm rejection can be achieved by neglecting wide-range touches during the self-capacitance detection.

The objectives of the present invention can be achieved by the following technical schemes. A method for position detection proposed by the present invention may include: providing a sensing device including a plurality of sensors including a plurality of first sensors and a plurality of second sensors, these first and second sensors intersecting each other at a plurality of intersecting points;

determining at least one first 1-D position corresponding to at least one external touch based on signals of these first sensors by self-capacitance detection; and determining at least one second 1-D position corresponding to the at least one first 1-D position based on signals of these second sensors by mutual-capacitance detection. In addition, a device for position detection proposed by the present invention may include: a sensing device including a plurality of sensors including a plurality of first sensors and a plurality of second sensors, these first and second sensors intersecting each other at a plurality of intersecting points; and a controller for performing at least the following operations: determining at least one first 1-D position corresponding to at least one external touch based on signals of these first sensors by self-capacitance detection; and determining at least one second 1-D position corresponding to the at least one first 1-D position based on signals of these second sensors by mutual-capacitance detection.

The objectives of the present invention can also be achieved by the following technical schemes. A method for position detection that neglects wide-area touches proposed by the present invention may include: providing a sensing device including a plurality of sensors including a plurality of first sensors and a plurality of second sensors, these first and second sensors intersecting each other at a plurality of intersecting points; obtaining a first 1-D sensing information from signals of the first sensors by self-capacitance detection; obtaining a second 1-D sensing information from signals of the second sensors by self-capacitance detection; a detected touch related sensing information is determined based on the range of each touch related sensing information on the first 1-D sensing information and the second 1-D sensing information, wherein each touch related sensing information corresponds to a touch or approach by at least one external object; at least one 1-D position is analyzed based on each detected touch related sensing information; and at least one 2-D position is analyzed by performing mutual-capacitance detection on each 1-D position. In addition, a device for position detection that neglects wide-area touches proposed by the present invention may include: a sensing device including a plurality of sensors including a plurality of first sensors and a plurality of second sensors, these first and second sensors intersecting each other at a plurality of intersecting points; and a controller for performing at least the following operations: obtaining a first 1-D sensing information from signals of the first sensors by self-capacitance detection; obtaining a second 1-D sensing information from signals of the second sensors by self-capacitance detection; a detected touch related sensing information is determined based on the range of each touch related sensing information on the first 1-D sensing information and the second 1-D sensing information, wherein each touch related sensing information corresponds to a touch or approach by at least one external object; at least one 1-D position is analyzed based on each detected touch related sensing information; and at least one 2-D position is analyzed by performing mutual-capacitance detection on each 1-D position.

By aforementioned technical schemes, the present invention achieves at least the following advantages and benefits:

1. by performing mutual-capacitance detection based on the result of self-capacitance detection, difficulty in the detections of close touches by self-capacitance detection can be alleviated;

2. by performing mutual-capacitance detection based on the mutual-capacitance detection, a more accurate position can be detected to reduce non linearity in touch traces; and 3. by neglecting wide-range touches during the self-capacitance detection, detection of input by a pen held by fingers with palm rejection can be achieved.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein:

FIG. 6C is an exemplary diagram according to the position detection that neglects wide-area touches of the present invention;

FIGS. 7A to 7D are flowcharts according to a first embodiment of the present invention.

DETAILED DESCRIPTION OF THE PREFERRED EMBODIMENTS

Figure 1A:
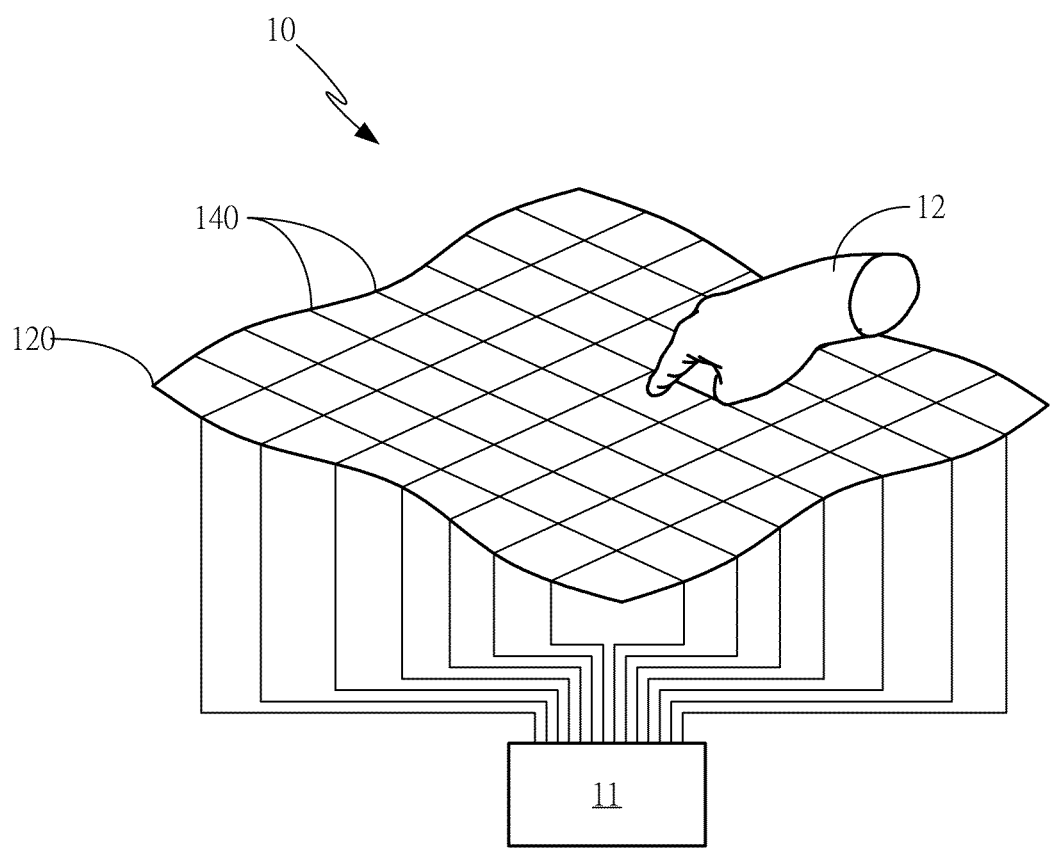
FIG. 1A is a schematic diagram depicting a prior-art touch sensitive device.

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

Sensing Information

In the present invention, sensing information can be provided by a touch sensitive device for representing 1-D, 2-D or multi-dimensional statuses on the touch sensitive device. The sensing information can be obtained by one or more sensors and converted into a plurality of continuous signal values by one or more Analog-to-Digital converters to represent among or change in amount of detected charges, current, voltage, capacitance, impedance or other electrical characteristics. Sensing information can be obtained or transmitted alternately, sequentially or in parallel, and can be compounded into one or more signals. These are obvious to those having ordinary skill in the art.

One having ordinary skill in the art may also recognize that sensing information described in the present invention includes, but not limited to, a signal of a sensor, a result of the signal of the sensors subtracted by a baseline (e.g. a signal when untouched or initial signals), a digitally converted value of said signal or said result of signal subtracted by baseline or said value converted in any other ways. In other words, sensing information can be in the form of a signal status, a status that is converted from any electrical signal or can be converted into electrical signal recorded in a storage medium (e.g. a register, a memory, a magnetic disk, an optical disk), including but not limited to analog or digital information.

Sensing information can be provided by two 1-D sensing information on different axes. The two 1-D sensing information can be used to represent the sensing information on a first axis (e.g. vertical axis) and a second axis (e.g. horizontal axis) on the touch sensitive device. They are used for position detection on the first and second axes, respectively, i.e. providing 1-D positions on the first and second axes or further constructing a 2-D position. In addition, the two 1-D sensing information can also be used for triangulation based on the distances between sensors to detect a 2-D position on the touch sensitive device.

Sensing information can be 2-D sensing information that consists of a plurality of 1-D sensing information on the same axis. The 2-D sensing information can represent signal distribution on a 2-D plane. For example, a plurality of 1-D sensing information on the vertical axis and a plurality of 1-D sensing information on the horizontal axis can represent a signal matrix, such that position detection can be achieved by watershed algorithm or other image processing methods.

In an example of the present invention, the sensing area on the touch sensitive device includes an overlapping range of a first 2-D detecting range detected by at least one first sensor and a second 2-D detecting range detected by at least one second sensor. One with ordinary skill in the art may also recognize that the sensing area can be an overlapping range of three or more 2-D detecting ranges.

For example, the detecting range of a single sensor can be a 2-D detecting range. A sensor (e.g. CCD or CMOS sensor) with camera-based optical detection or a piezoelectric sensor with surface acoustic wave detection obtains 1-D sensing information in the 2-D detecting range. The 1-D sensing information can be comprised of information sensed at a plurality of continuous time points, which correspond to different angles, positions or ranges. In addition, the 1-D sensing information can be generated according to images obtained (e.g. by CCD-CMOS sensor) within a time interval.

Furthermore, for example, the 2-D sensing range can consist of detecting ranges of a plurality of sensors. For example, the detecting range of each infrared photoreceptor, capacitive or resistive conductive bar or strip, or inductive U-shape coil is a fan or stripe shaped detecting range towards one axis. The detecting ranges of a plurality of sensors arranged on the same axis on a line segment (straight or curved) can form a 2-D detecting range of that axis, which can be a square or fan-shaped planar or arc detecting range, for example.

In a preferred example of the present invention, the sensing area on the touch sensitive device includes a 2-D range detected by a plurality of sensors on the first and second axes. For example, through self-capacitive detection, a driving signal is provided to a plurality of first sensors, and capacitive-coupling signals or changes in said signal in a 2-D detecting range of these first sensors are sensed to obtain first 1-D sensing information. Furthermore, a driving signal is provided to a plurality of second sensors, and capacitive-coupling signals or changes in said signal in a 2-D detecting range of these second sensors are sensed to obtain second 1-D sensing information.

In another example of the present invention, the sensing area on the touch sensitive device involves a plurality of sensors detecting a plurality of 1-D sensing information in a 2-D sensing range to construct 2-D sensing information. For example, when a signal source sequentially applies a driving signal to sensors on a first axis, signal(s) of at least one of sensors in a second axis is sequentially detected or on a plurality of sensors (partially or all) are simultaneously detected to obtain 2-D sensing information on the axis, wherein the sensors are adjacent or not adjacent but neighboring sensors on the second axis. For example, in mutual-capacitive detection or analog matrix resistive detection, a plurality of sensors constitute a plurality of sensing areas for detecting sensing information at each respective area. For example, a plurality of first sensors (e.g. a plurality of first conductive lines) and a plurality of second sensors (e.g. a plurality of second conductive lines) intersect with each other to from a plurality of overlapping regions. When a driving signal is sequentially provided to each of the first sensors, corresponding to the first sensor being driven by the driving signal, signal(s) or changes in signal(s) on at least one of the second sensors on the second axis is sequentially detected or on a plurality of the second sensors (partially or all) on the second axis are simultaneously detected to obtain 1-D sensing information corresponding to that first sensor. By collecting 1-D sensing information corresponding to each of the first sensors together, 2-D sensing information can be constructed. In an example of the present invention, 2-D sensing information can be regarded as an image.

One with ordinary skill in the art can appreciate that the present invention can be applied to touch sensitive display, for example, a display attached with aforementioned resistive, capacitive, surface acoustic wave, or other touch detection device (or referred to as touch sensitive device). Thus, sensing information obtained by the touch sensitive display or device can be regarded as touch sensitive information.

In an example of the present invention, a touch sensitive device may use continuous signals from different time points, that is, composite signal continuously detected by one sensor or simultaneously by a plurality of sensors. For example, the touch sensitive device may be inductive and continuously scan coils thereon to emit electromagnetic waves. Meanwhile, sensing information is detected by one or more sensors on an electromagnetic pen and continuously compounded to form a signal. This signal is then converted into a plurality of continuous signal values by an ADC. Alternatively, electromagnetic waves are emitted by an electromagnetic pen or electromagnetic waves from an inductive touch sensitive device are reflected, and sensing information is obtained by a plurality of sensors (coils) on the touch sensitive device.

Touch Related Sensing Information

When an external object (e.g. a finger) touches or approaches a touch sensitive device, electrical characteristic or changes will be generated by sensing information at an area corresponding to the touch or proximity of the object. The larger the electrical characteristic or changes, the closer it is to the center (e.g. centroid, center of gravity of center of geometry) of the external object. Continuous sensing information can be regarded as constituted by a plurality of continuous values whether it is digital or analog. The center of the external object may correspond between one or two values. In the present invention, a plurality of continuous values can be spatially or temporally continuous.

Figure 1B:
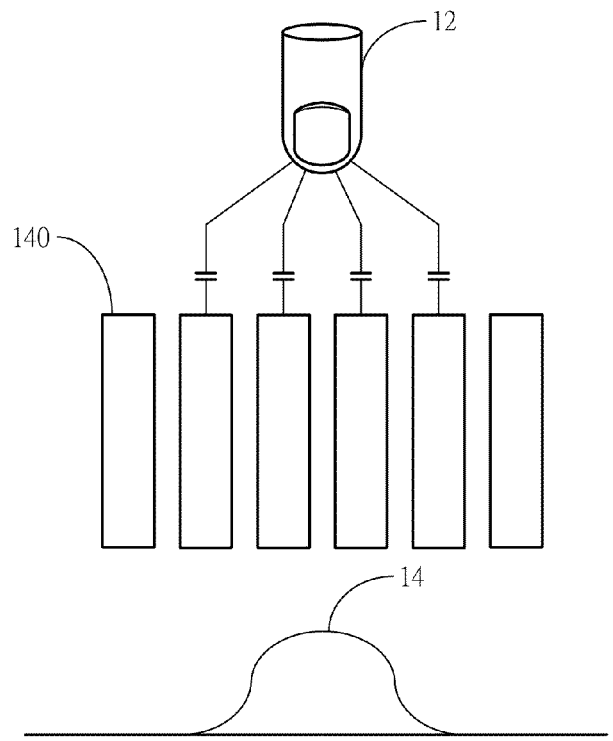
FIG. 1B is a schematic diagram illustrating prior-art signal values.

A first type of 1-D sensing information provided by the present invention is in the form of a plurality of continuous signal values, which can be signal values detected by a plurality of sensors in a time interval, by a single sensor in a continuous time interval or by a single sensor in a single time interval at different detecting locations. In the process of representing sensing information as signal values, signals from respective sensors, time intervals or locations are sequentially converted into signal values, or part or all of sensing information is obtained, thereafter, respective signal values are then analyzed. When an external object touches or draws near to a sensing device, continuous signal values of 1-D sensing information can be those as shown in FIG. 1B. Position touched by the external object corresponds to the peak 14 of the sensing information, wherein peak 14 may reside between two signal values. As described earlier, the present invention does not limit the form of sensing information. Signal values can be another form of the signals of the sensors. For brevity of the description, the present invention below is described in the context of implementations of the signal values. One with ordinary skill in the art may appreciate the implementations of signals from the implementations of signal values.

A second type of 1-D sensing information provided by the present invention is in the form of a plurality of continuous differences, compared to the signal values above, each difference is the difference of a pair of signal values, and the sensing information represented by a plurality of differences can be regarded as differential sensing information. In the present invention, differential sensing information can be obtained directly during sensing, for example, simultaneously or continuously obtaining a plurality of signals, each difference being generated based on a differential signal corresponding to a pair of sensor, time intervals, or locations. The differential sensing information can be generated based on the original sensing information including a plurality of signal values generated previously. As described earlier, the present invention does not limit the form of sensing information. Differences can be another form of the differential signals. For brevity of the description, the present invention below is described in the context of implementations of the differences. One with ordinary skill in the art may appreciate the implementations of differential signals from the implementations of differences.

Figure 1C:
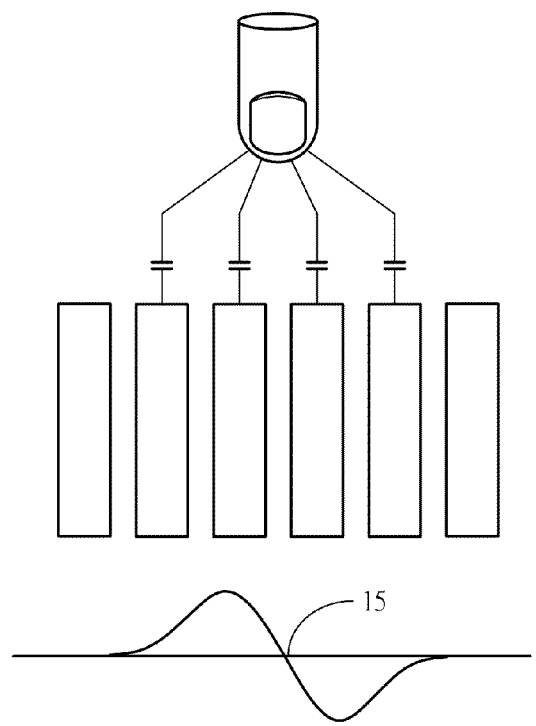
FIG. 1C is a schematic diagram illustrating differences according to the present invention.

In an example of the present invention, a difference can be the difference between a pair of adjacent or not adjacent signal values, for example, the difference between a signal value and its immediately preceding signal value, or between a signal value and its following signal value. In another example of the present invention, the difference can be the difference between non-adjacent signal values. When an external object touches or draws close to the touch sensitive device, continuous differences of 1-D sensing information can be those shown in FIG. 1C, wherein the position of the external object corresponds to zero-crossing 15 of the sensing information. Zero-crossing 15 may reside between two signal values. In an example of the present invention, on the touch sensitive device, the location of each difference is the middle of the two corresponding signal values.

A third type of 1-D sensing information provided by the present invention is in the form of a plurality of continuous dual differences, compared to the signal values and differences above, each dual difference can be the sum or difference of the difference for a first pair of signal values and the difference for a second pair of signal values, that is, the sum or difference of the differences of two pairs of signal values. For example, two pairs of signal values include a first signal value, a second signal value, a third signal value, and a fourth signal value. The dual difference for these four signals is (second signal value−first signal value)+(third signal value−fourth signal value), (second signal value−first signal value)−(fourth signal value−third signal value), (first signal value−second signal value)+(fourth signal value−third signal value) or (first signal value−second signal value)−(third signal value−fourth signal value). In addition, sensing information represented by continuous dual differences can be regarded as dual-differential sensing information. In the present invention, a dual difference is not limited to being provided after signal values or differences, but can also be provided through the sum or difference after subtraction of two pairs of signals upon sensing information being provided, providing dual differential signal similar or equivalent to the sum or difference of the differences between two pair of signal values. As described earlier, the present invention does not limit the form of sensing information. Dual differences can be another form of the dual differential signals. For brevity of the description, the present invention below is described in the context of implementations of the dual differences. One with ordinary skill in the art may appreciate the implementations of dual differential signals from the implementations of dual differences.

Figure 1D:
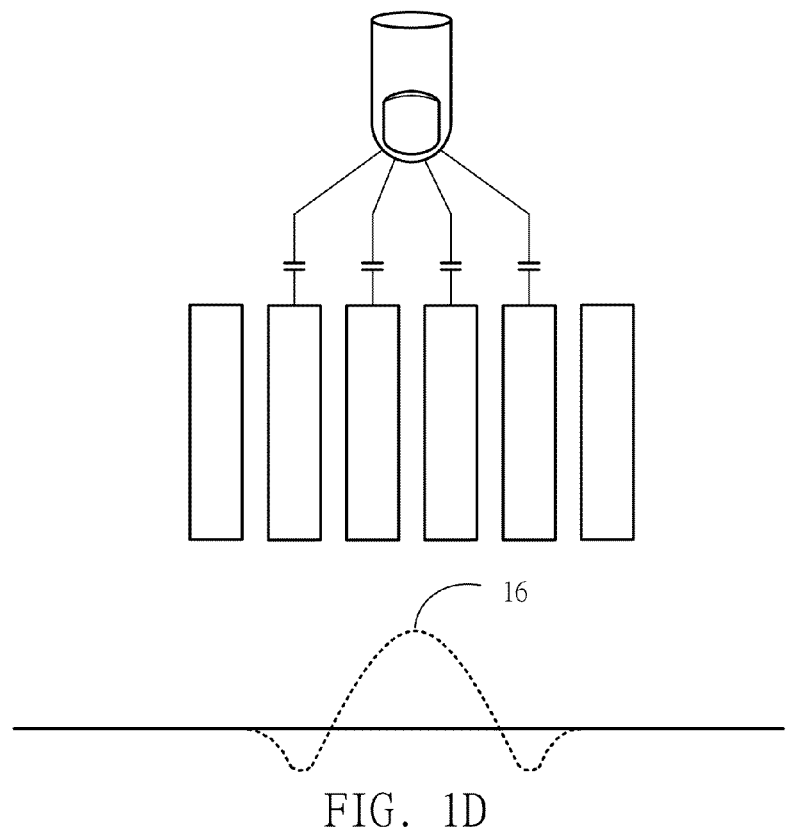
FIGS. 1D and 1E are schematic diagrams illustrating dual differences according to the present invention.
Figure 1E:
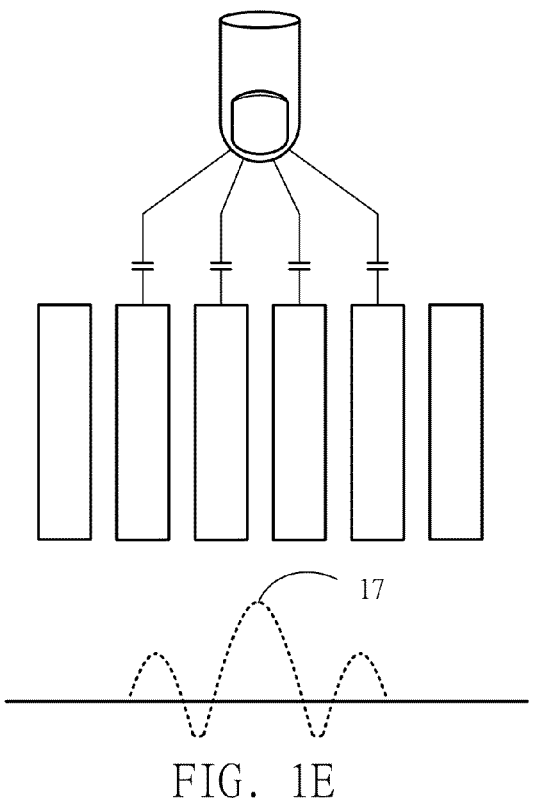

In an example of the present invention, when the external object touches or approaches the touch sensitive device, two pairs of signal values are constituted by three adjacent or non-adjacent signal values. In an example of the present invention, the differences between the prior two signal values and the latter two signal values are a first difference and a second difference, respectively, and the dual difference is the difference between the first difference and the second difference, wherein the first difference and the second difference both can be the results of the preceding signal value minus the following signal value or the following signal value minus the preceding signal value. In another example of the present invention, the differences between the first two signal values and the last two signal values are a first difference and a second difference, respectively, and the dual difference is the sum of the first difference and the second difference, wherein one of the first difference and the second difference is the result of the preceding signal value minus the following signal value, whereas the other one of the first difference and the second difference is the result of the following signal value minus the preceding signal value. For example, two pairs of signal values include a first signal, a second signal, and a third signal. The dual difference for these three signal values is (second signal value−first signal value)+(second signal value−third signal value), (second signal value−first signal value)−(third signal value−second signal value), (first signal value−second signal value)+(third signal value−second signal value), or (first signal value−second signal value)−(second signal value−third signal value). When two pairs of signal values are constituted by three adjacent signal values, and an external object touches or approaches the touch sensitive device, the continuous dual differences of 1-D sensing information can be those shown in FIG. 1D, wherein the position of the external object corresponds to middle peak 16 of the sensing information. Middle peak 16 may reside between two signal values. When two pairs of signal values are constituted by three non-adjacent signal values, and an external object touches or approaches the touch sensitive device, the continuous dual differences of 1-D sensing information can be those shown in FIG. 1E, wherein the position of the external object corresponds to middle peak 17 of the sensing information. Middle peak 17 may reside between two signal values.

In the present invention, sensing information corresponding to respective sensor, time interval or position can be signals detected by the sensors. When the signals are analog, it can be converted into digital signal values by an ADC. Thus, the above difference can also be the value of the difference between a pair of signals, for example, value converted from a pair of signals subtracted via a differential amplifier. Similarly, the above dual difference can also be the value converted from two pairs of signals subtracted via a differential amplifier and then added (or subtracted) together. One with ordinary skill in the art can appreciate that the difference and dual difference described by the present invention not only include being generated by signals or signal values, but also include temporary states of records (electrical, magnetic or optical records), signals or signal values during hardware or software implementations.

In other words, sensing information can be signals, differential signals (e.g. difference between a pair of signals), dual differential signals (e.g. sum or difference of two pairs of signals) on or between the sensors, and signal values, differences, dual differences (analog-to-digital converted signal values, differences or dual differences) can be another form. Signals and signal values, differential signals and differences, and dual differential signals and dual differences are sensing information represented at different stages. In addition, for brevity of the description, touch related sensing information mentioned herein broadly refers to sensing information corresponding to touch or proximity of an external object, such as original touch related sensing information, differential touch related sensing information and dual-differential touch related sensing information.

One with ordinary skill in the art can appreciate that in the case of differences or dual differences, zero-crossing is between at least one positive value and at least one negative value that is between a pair of positive and negative values. The difference or dual difference that corresponds to the touch or proximity of the external object may be an alternating continuous combination of at least one positive value and at least one negative value, wherein at least one zero value is interposed between the at least one positive value and at least one negative value. In most cases, the difference or dual difference that corresponds to the touch or proximity of the external object is an alternating continuous combination of multiple positive values and multiple negative values, wherein zero-crossings between positive and negative values may be at least a zero value or between two values.

In contrast, touch related signal values include a plurality of continuous non-zero values, or an independent non-zero value not adjacent to other non-zero values. In some cases, an independent non-zero value not adjacent to other non-zero values may be generated by noise, which should be identified and neglected by thresholding or other types of mechanisms.

Since noise could generate zero-crossing similar to the touch or proximity of an external object when large, thus in an example of the present invention, values that fall within a zero-value range will be treated as zero values. Difference or dual difference corresponding to the touch or proximity of an external object is an alternating continuous combination of multiple values above a positive threshold and multiple values below a negative threshold, wherein a zero-crossing between a value above the positive threshold and a value below a negative threshold may be at least one zero value or between two values.

In summary of the above, differential touch related sensing information and dual-differential touch related sensing information are alternating continuous combinations of at least one positive value and at least one negative value including a zero-crossing, wherein the zero-crossing can be at least one zero value or between the positive and negative values. In other words, a plurality of continuous zero values between positive and negative values in the differential touch related sensing information and dual-differential touch related sensing information are treated as zero-crossings, or one of which is treated as a zero-crossing.

In an example of the present invention, touch related sensing information is set to begin with at least a positive or negative value, and from there an alternating continuous combination of at least one positive value and at least one negative value including a zero-crossing is searched, wherein the zero-crossing may be at least one zero value or between positive and negative values. In differential touch related sensing information, alternating combinations of at least one positive value and at least one negative value occur symmetrically, and in dual-differential touch related sensing information, alternating combinations of at least one positive value and at least one negative value do not occur symmetrically. In an example of the present invention, touch related sensing information is continuous non-zero values, e.g. a plurality of continuous non-zero signal values.

The at least one positive value above can be regarded as a positive-value set including at least one positive value. Similarly, the at least one negative value above can be regarded as a negative-value set including at least one negative value. Thus, the above alternating combination can be a combination of two sets: a positive-value set and a negative-value set, or a combination of three or more set with alternating positive-value and negative-value sets. In an example of the present invention, at least one zero value may exist between zero, one, or multiple positive-value and negative-value sets.

System Framework

In order to more clearly illustrate how sensing information of the present invention is generated, the present invention uses a capacitive touch sensitive device as an example, and one with ordinary skill in the art can readily recognize other applications such as in resistive, infrared, surface acoustic wave, or optical touch sensitive devices.

Figure 1F:
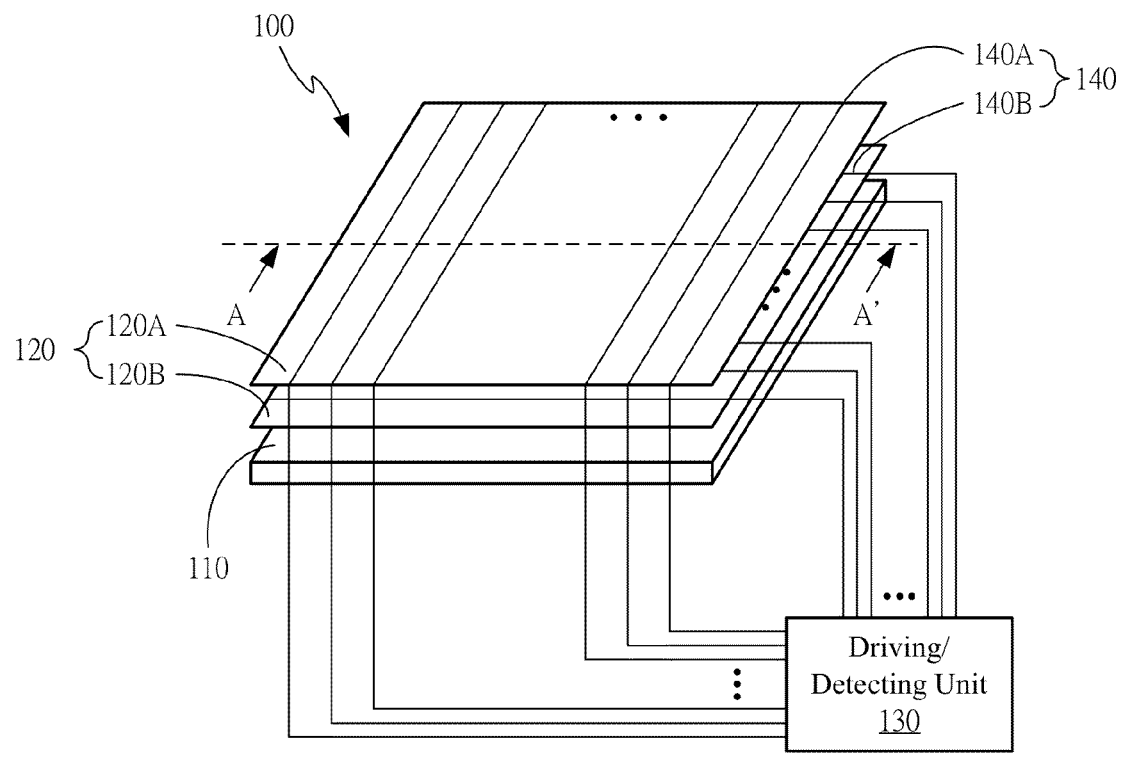
FIG. 1F is a schematic diagram illustrating a sensing device according to the present invention.

Referring to FIG. 1F, the present invention provides a position detecting device 100. As shown, the device includes a sensing device 120 and a driving/detecting unit 130. Sensing device 120 has a sensing layer. In an example of the present invention, the sensing layer can include a first sensing layer 120A and a second sensing layer 120B. First and second sensing layers 120A and 120B each has a plurality of sensors 140, wherein first sensors 140A of first sensing layer 120A cross upon second sensors 140B of second sensing layer 120B. In another example of the present invention, first and second sensors 140A and 140B are disposed in a co-planar sensing layer. Driving/detecting unit 130 produces sensing information based on signals of sensors 140. In the case of self-capacitive detection, for example, sensors 140 driven are sensed. In the case of mutual-capacitive detection, some of sensors 140 not directly driven by driving/detecting unit 130 are sensed. In addition, sensing device 120 can be disposed on a display 110. An optional shielding layer (not shown) can be interposed between sensing device 120 and display 110.

Figure 1G:
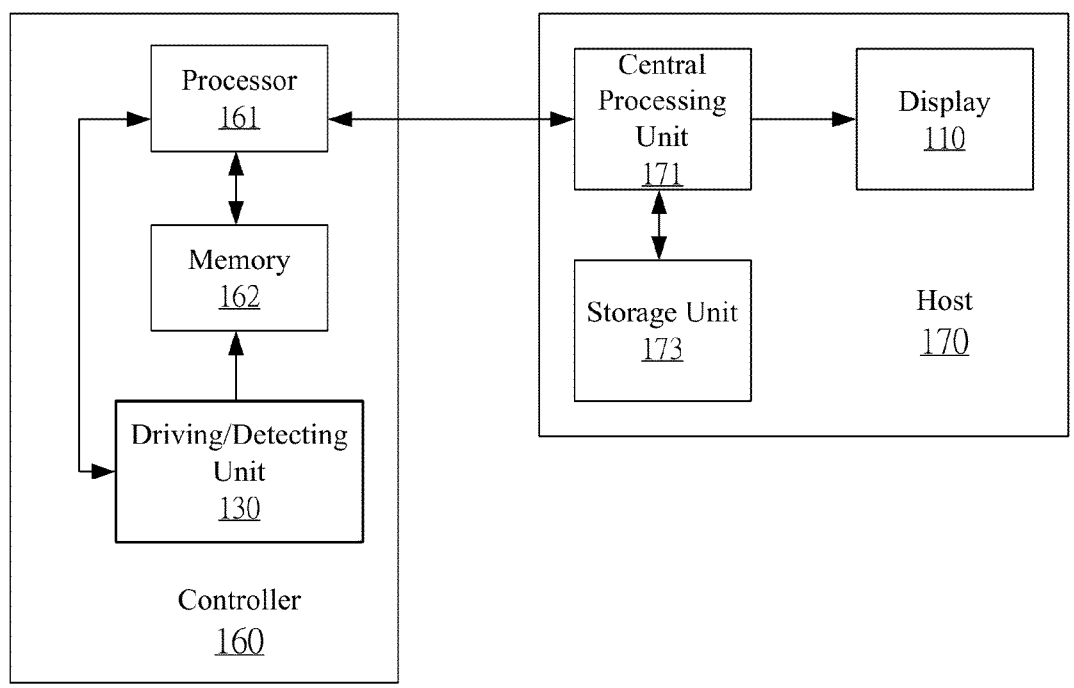
FIG. 1G is a block diagram illustrating functions of a computing system according to the present invention.

The position detecting device 100 of the present invention can be applied to a computing system as shown in FIG. 1G, which includes a controller 160 and a host 170. The controller includes driving/detecting unit 130 to operatively couple sensing device 120 (not shown). In addition, controller 160 can include a processor 161 for controlling driving/detecting unit 130 in generating sensing information. Sensing information can be stored in a memory 162 and accessible by processor 161. Moreover, host 170 constitutes the main body of the computing system, mainly includes a central processing unit 171, a storage unit 173 that can be accessed by central processing unit 171, and display 110 for displaying results of operations.

In another example of the present invention, there is a transmission interface between controller 160 and host 170. The controlling unit transmits data to the host via the transmission interface. One with ordinary skill in the art can appreciate that the transmission interface may include, but not limited to, UART, USB, I²C, Bluetooth, Wi-Fi wireless or wired transmission interfaces. In an example of the present invention, data transmitted can be position (e.g. coordinates), identification results (e.g. gesture codes), command, sensing information or other information provided by controller 160.

In an example of the present invention, sensing information can be initial sensing information generated under the control of processor 161, and position analysis is carried out by host 170, such as position analysis, gesture identification, command identification etc. In another example of the present invention, sensing information can be analyzed by processor 161 first before forwarding determined position, gesture or command etc. to host 170. The present invention does not limit to this example, and one with ordinary skill in the art can readily recognize other interactions between controller 160 and host 170.

Figure 2A:
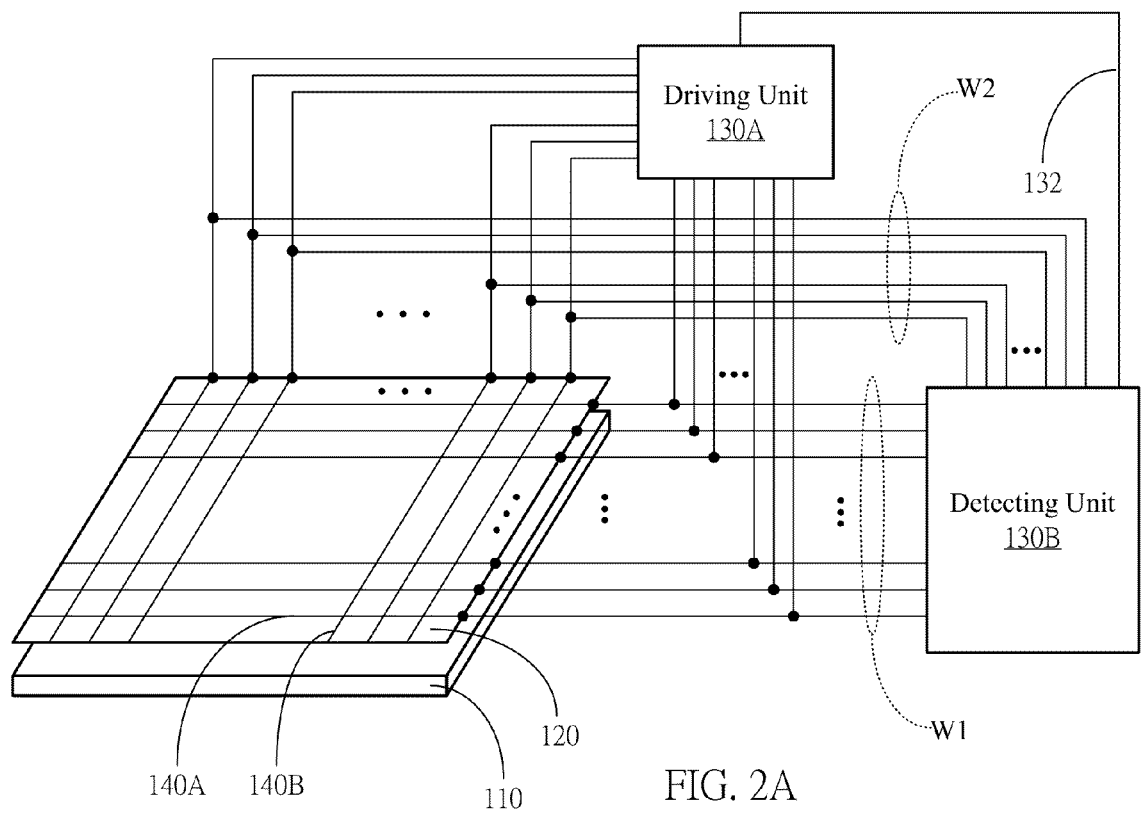
FIGS. 2A and 2B are schematic diagrams illustrating a driving/detecting unit and a sensing device according to the present invention.

Referring to FIG. 2A, in an example of the present invention, driving/detecting unit 130 may include a driving unit 130A and a detecting unit 130B. The plurality of sensors 140 of sensing device 120 are operatively coupled to driving/detecting unit 130 via a plurality of wires. In the example of FIG. 2A, driving unit 130A and detecting unit 130B are operatively coupled to sensors 140A via wires W1 and to sensors 140B via wires W2.

For example, in self-capacitive detection, all sensors 140A are sequentially or simultaneously driven or some of sensors 140A are driven simultaneously in batch by driving unit 130A via wires W1 in a first time period. Sensing information of a first axis (1-D sensing information) is generated via wires W1 by detecting unit 130 based on signals of sensors 140A. Similarly, all sensors 140B are sequentially or simultaneously driven or some of sensors 140A are driven simultaneously in batch by driving unit 130A via wires W2 in a second time period. Sensing information of a second axis (1-D sensing information) is generated via wires W2 by detecting unit 130 based on signals of sensors 140B.

For example, in mutual-capacitive detection, sensors 140B are driven by driving unit 130 via wires W2 in a first time period, and when each sensor 140B is respectively driven, 1-D sensing information corresponding to a first axis of the driven sensors is generated by detecting unit 130B based on signals of sensors 140A via wires W1. These 1-D sensing information on the first axis construct 2-D sensing information (or an image) on the first axis. Similarly, sensors 140A are driven by driving unit 130 via wires W1 in a second time period, and when each sensor 140A is respectively driven, 1-D sensing information corresponding to a second axis of the driven sensors is generated by detecting unit 130B based on signals of sensors 140B via wires W2. These 1-D sensing information on the second axis construct 2-D sensing information (or an image) on the second axis. In addition, driving unit 130A and detecting unit 130B can be synchronized via lines 132 by providing signals. The signals on lines 132 can be provided by said processor 160.

Figure 2B:
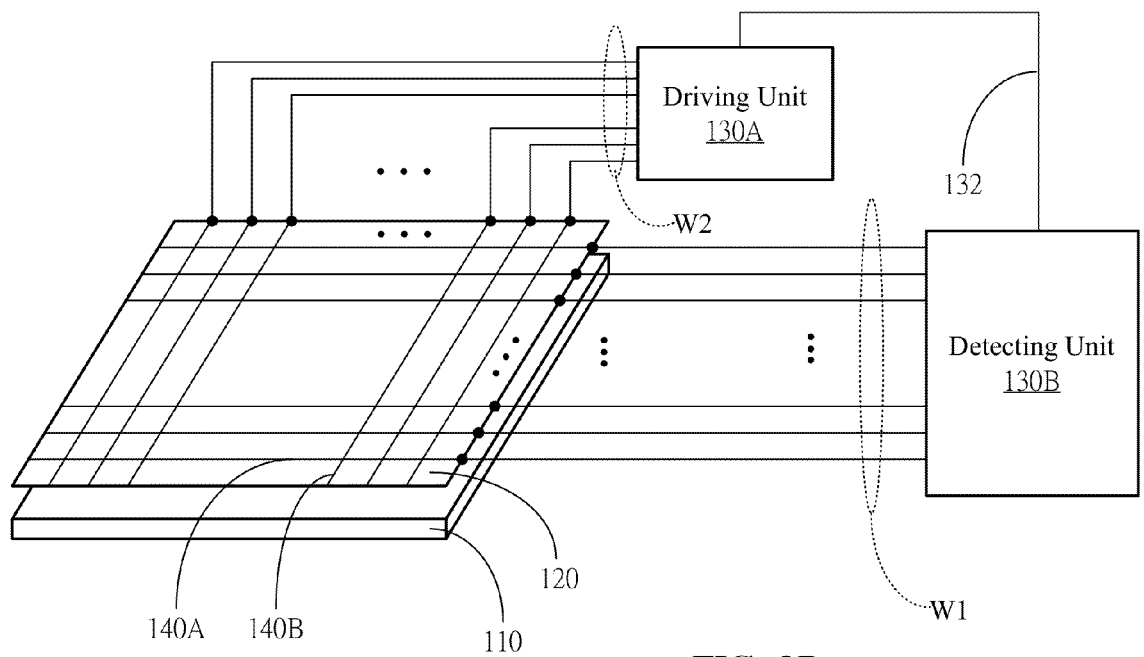

Referring to FIG. 2B, sensor device 120 can also generate 2-D sensing information on only a single axis. In this example, sensors 140B are driven by wires W2, and when each sensor 140B is respectively driven, 1-D sensing information of the driven sensor is generated by detecting unit 130B based on the signals of sensors 140A via wires W1. These 1-D sensing information constitute 2-D sensing information (or an image).

In other words, position detecting device 100 of the present invention is capable of producing 1-D sensing information in 2 axes or 2-D sensing information in 2 axes, producing both 1-D and 2-D sensing information in 2 axes, or producing 2-D sensing information in a single axis. The present invention may include but not limited to said capacitive position detecting device, one with ordinary skill in the art can appreciate other applications, such as in resistive, capacitive, surface acoustic wave, or other touch sensitive device.

Figure 3A:
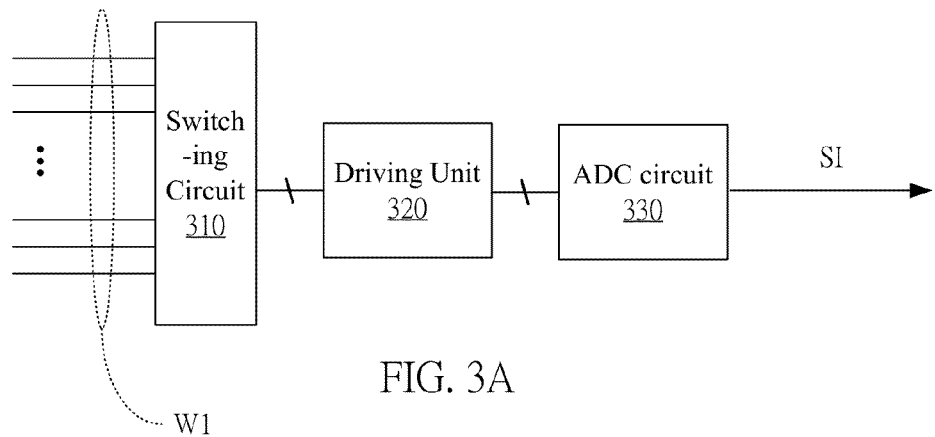
FIG. 3A is a block diagram illustrating functions of a detecting unit according to the present invention.

Referring to FIG. 3A, detecting unit 130B is operatively coupled to the sensing device via wires (e.g. W1). The operative coupling can be achieved by a switching circuit 310, which can be one or more electrical elements such as multiplexers and/or switches. One with ordinary skill in the art can recognize other use of switching circuits. Signals of sensors 140 can be detected by a detecting circuit 320. When signal output by detecting circuit 320 is analog, it is then passed through ADC circuit 330 to generate sensing information SI. Sensing information SI can be analog or digital. In a preferred example of the present invention, sensing information is digital, but the present invention is not limited to the above example. One with ordinary skill in the art can appreciate that detecting circuit 320 and ADC circuit 330 can be integrated in one or more circuits.

Detecting circuit 320 can be comprised of one or more detectors, each receiving a signal from at least one sensor 140 and generating an output. The detectors can be detectors 340, 350 and 360 shown in FIGS. 3B to 3D.

In an example of the present invention, the detection of the signals of sensors 140 can be achieved by an integrator. One with ordinary skill in the art can appreciate other circuits that measure electrical characteristics (e.g. voltage, current, capacitance, induction etc.), such as an ADC, can be applied to the present invention. An integrator can be implemented by an amplifier Cint, which includes an input (e.g. as shown by integrator 322 of FIG. 3B) or a pair of input (e.g. as shown by integrator 324 of FIGS. 3C and 3D) and an output. Output signal can be used by ADC circuit 330 to generate values of sensing information SI, each of these values can be controlled by a reset signal, such as a reset signal Sreset shown in FIGS. 3B to 3D.

Figure 3B:
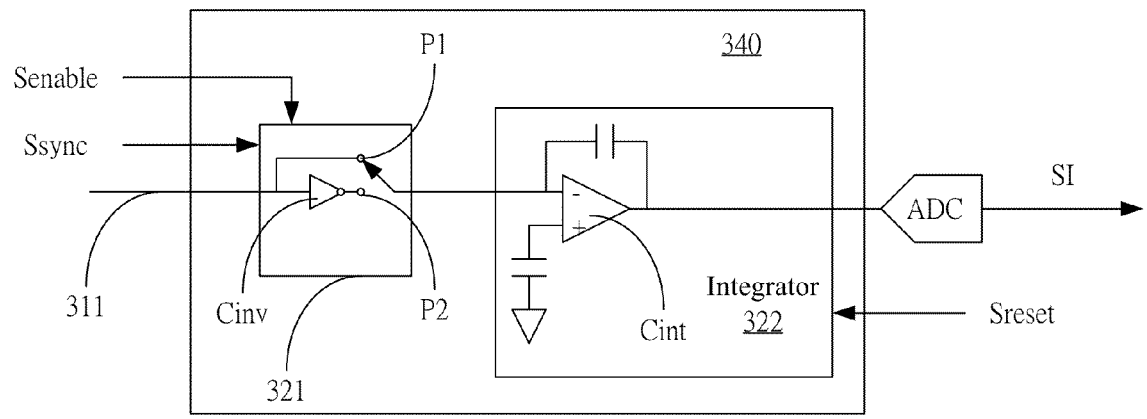
FIGS. 3B to 3D are circuit diagrams illustrating detectors according to the present invention.
Figure 3C:
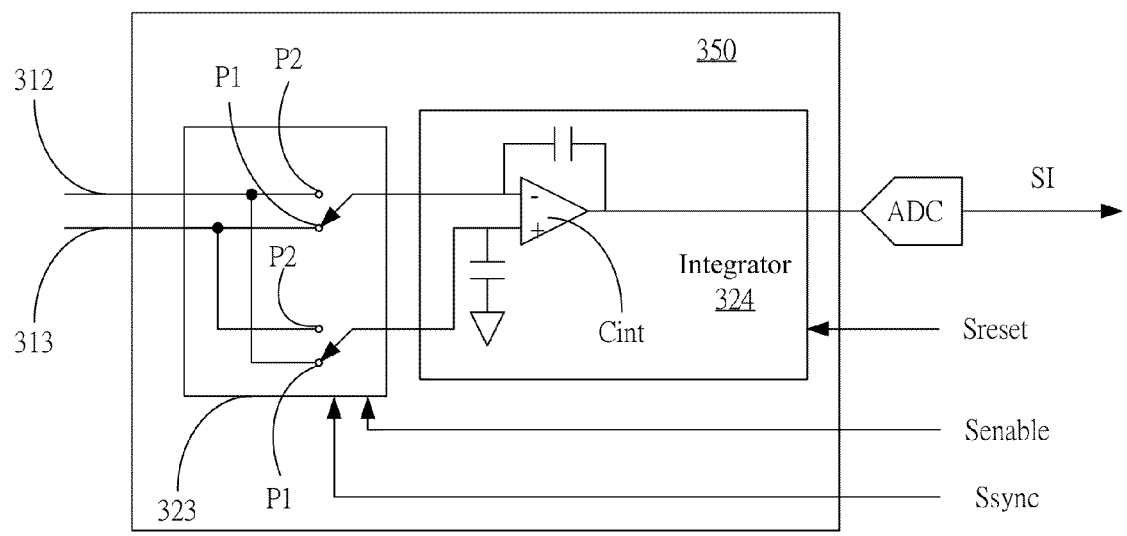

In another example of the present invention, signals of sensors 140 are AC signals that vary with a pair of half cycles. Thus, the detection of the signals of sensors 140 also changes with different half cycles. For example, signals of sensors 140 are detected in the prior half cycle, and inverse signals of sensors 140 are detected in the latter half cycle, or vice versa. Therefore, the detection of the signals of sensors 140 can be controlled by a synchronizing signal Ssync, as shown in FIGS. 3B to 3C. Synchronizing signal Ssync and the signals of sensors 140 are in sync or having the same cycle. For example, synchronizing signal Ssync is used to control one or more switches (e.g. switching circuits 321, 323, 325) to switch between base points P1 and P2, so as to detect the signals of sensor 140 in the prior half cycle, and to detect the inverse signals of sensor 140 in the latter half cycle. In FIG. 3B, the inverse signals are provided by an inverter Cinv.

In yet another example of the present invention, the detection of the signals of sensors 140 is performed in at least a predetermined time interval (or phase) in at least a cycle. Detection can be done in at least an interval in the first half cycle and at least an interval in the second half cycle; or in at least an interval in only the first or second half cycle. In a preferred example of the present invention, at least a preferred time interval in a cycle is scanned as the detection interval, wherein noise interference in this detection interval is smaller than in other intervals. Scanning of the detection interval can be determined by the detection of the signal of at least one sensor in each interval in at least a cycle. Upon determining a detection interval, detection of the signals of sensors is performed only in that detection interval, and this can be controlled by a signal, such as an enable signal Senable in FIGS. 3B to 3D.

Figure 3D:
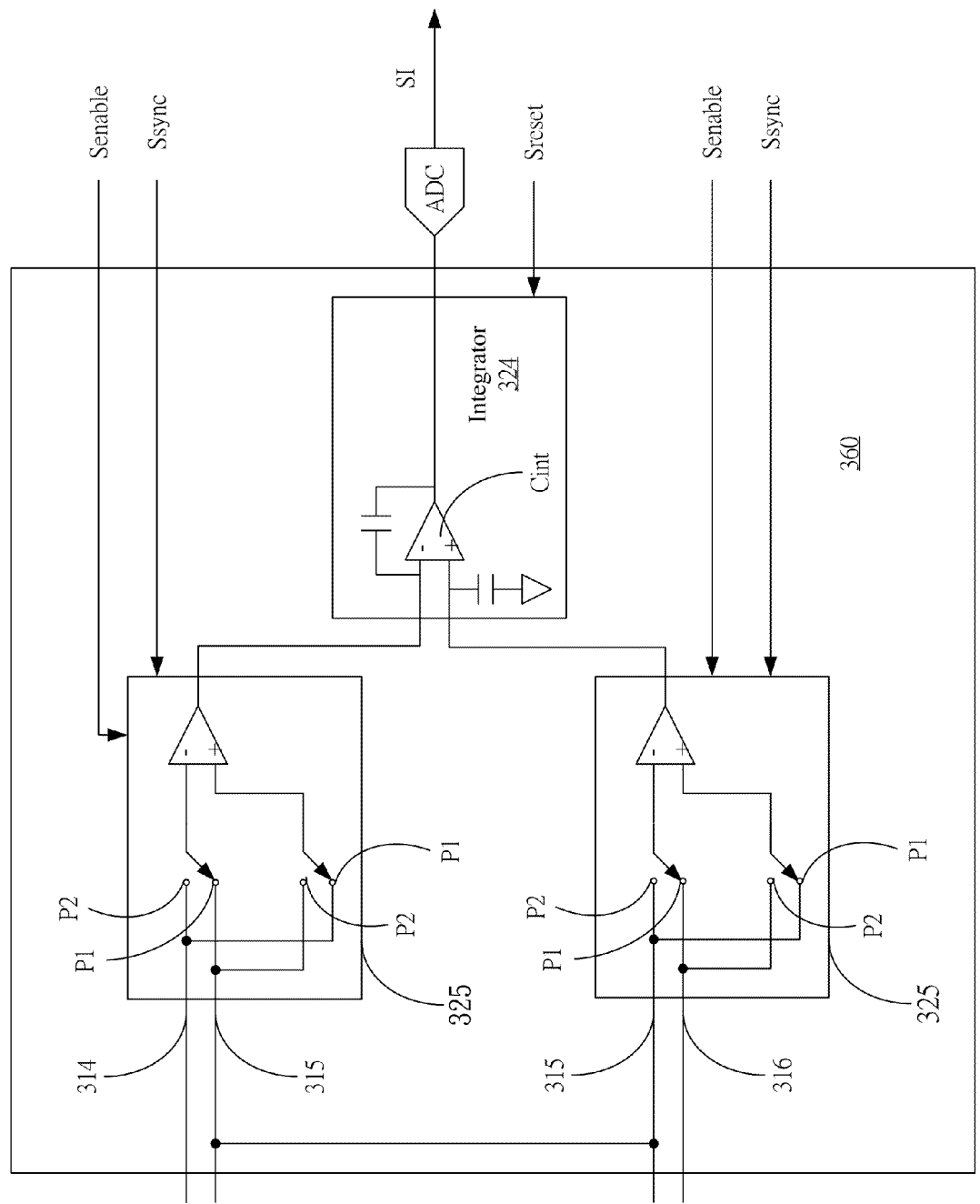

The present invention generates the values of sensing information SI based on the signal of at least one sensor 140. In an example of the present invention, sensing information SI consists of a plurality of signal values. As shown in FIG. 3B, an input 311 is operatively coupled to a sensor 140 for detecting a signal and a signal value of sensing information SI is generated through ADC circuit 330. In another example of the present invention, sensing information SI consists of a plurality of differences. As shown in FIG. 3C, a pair of inputs 312 and 313 are operatively coupled to a sensor 140 for detecting a differential signal and a difference (or single difference) of sensing information SI is generated through ADC circuit 330. In yet another example of the present invention, sensing information SI consists of a plurality of dual differences. As shown in FIG. 3D, three inputs 314, 315 and 316 are operatively coupled to a sensor 140 for detecting a dual differential signal and a dual difference of sensing information SI is generated through ADC circuit 330. A dual differential signal is generated from the difference between a pair of differential signals; each differential signal is generated based on signals of a pair of sensors. In other words, a dual differential signal is generated based on signals of a first pair of sensors and a second pair of sensors, wherein the first pair of sensors are the first two sensors in the three sensors, and the second pair of sensors are the latter two sensors in the three sensors; these three sensors can be adjacent or not adjacent.

In a preferred example of the present invention, detecting circuit 320 includes a plurality of detectors, which simultaneously generate all or some values of sensing information SI. As shown in FIGS. 3E to 3J, detecting circuit 320 can comprise of a detector 340, 350 or 360. The output of the detector is then converted into values of sensing information SI by ADC circuit 330.

Figure 3E:
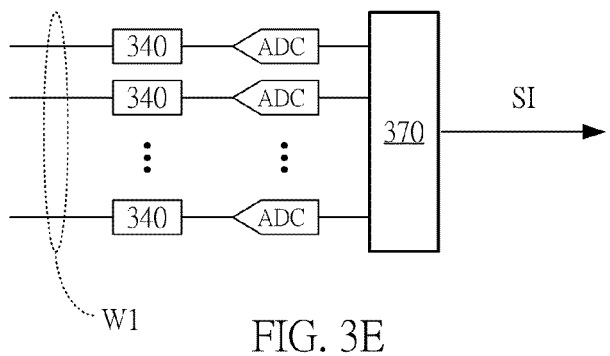
FIGS. 3E to 3J are diagrams showing connections between a detecting circuit and an ADC circuit according to the present invention.
Figure 3F:
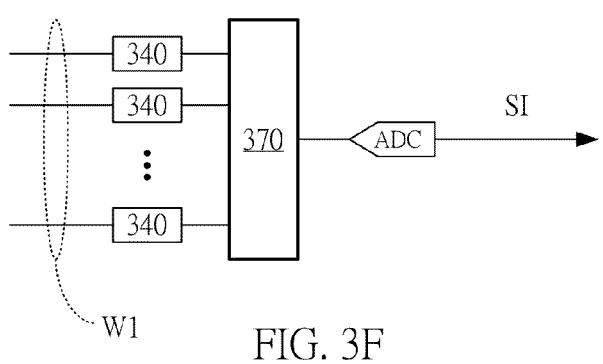
Figure 3G:
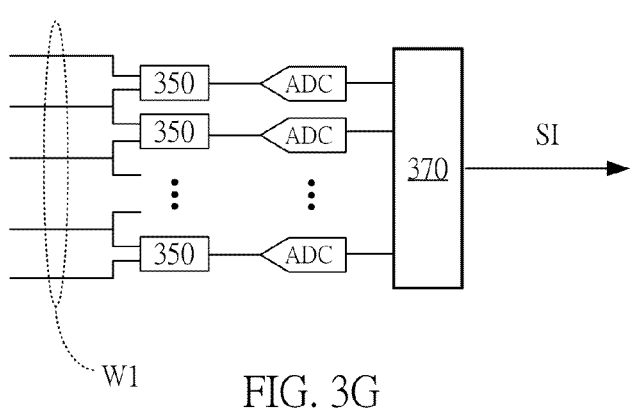
Figure 3H:
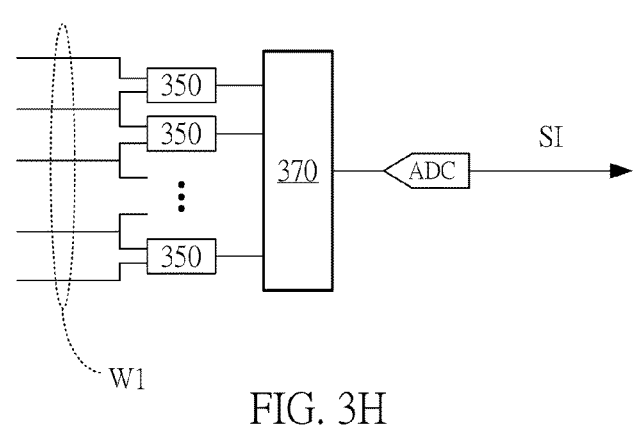
Figure 3I:
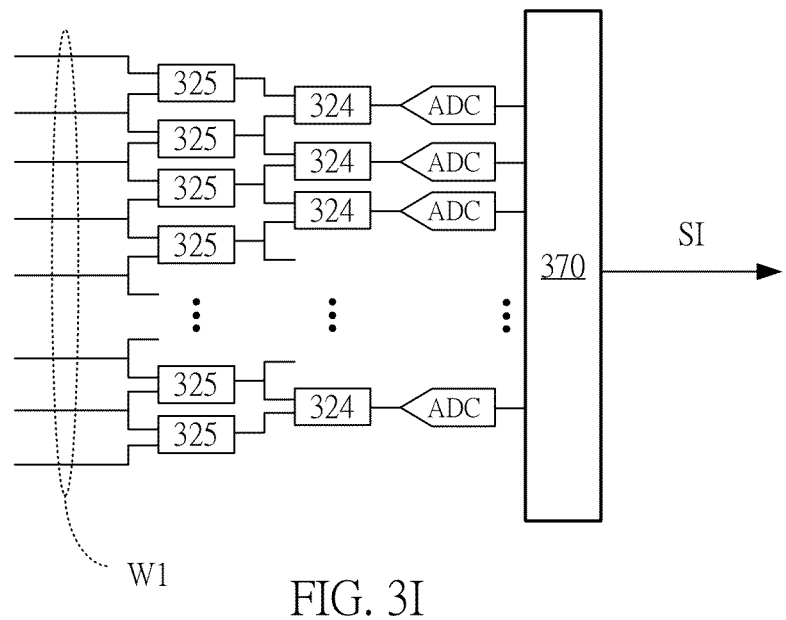
Figure 3J:
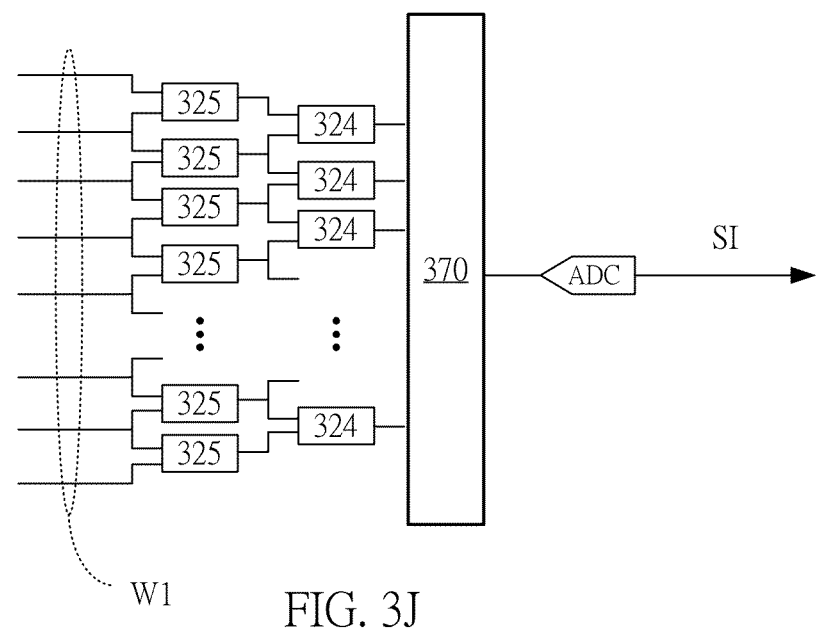

ADC circuit 330 includes at least one ADC. Each ADC may output values of sensing information SI based on an output of only one detector, as shown in FIGS. 3E, 3G and 3I. Alternatively, an ADC may output values of sensing information SI based on outputs of several detectors in turn, as shown in FIGS. 3F, 3H and 3J. Values of sensing information SI can be generated in parallel or in series. In a preferred example of the present invention, values of sensing information SI are generated in series, which can be achieved by a switching circuit 370, for example, by outputting values of sensing information SI from a plurality of ADCs in turn, as shown in FIGS. 3E, 3G, and 3I, or by providing outputs of a plurality of integrators to a single ADC in turn to generate values of sensing information SI, as shown in FIGS. 3F, 3H and 3J.

Accordingly, in an example of the present invention, sensing information SI having a plurality of signal values are generated based on signals of a plurality of sensors, wherein each signal value is generated based on a signal from a sensor, as shown in FIGS. 3B, 3E and 3F. In another example of the present invention, sensing information SI having a plurality of differences are generated based on signals of a plurality of sensors, wherein each difference is generated based on signals from a pair of sensors, as shown in FIGS. 3C, 3G and 3H. In yet another example of the present invention, sensing information SI having a plurality of dual differences are generated based on signals of a plurality of sensors, wherein each dual difference is generated based on signals from three sensors, as shown in FIGS. 3D, 3I and 3J.

In FIGS. 3E to 3J, wires connecting the detectors may include but not limited to wires W1 and wires W2. Connection between an integrator and a wire can be direct or indirect through a switching circuit, as shown in FIG. 3A. In an example of the present invention, values of sensing information are generated by multiple detections by at least a detector of detecting circuit 320. Detecting circuit 320 selects some of the sensors for detection by using switching circuit 310. In addition, only selected sensors are driven by driving unit 130A, for example, in self-capacitive detection. Moreover, only selected sensors and some sensors adjacent to the selected sensors are driven by driving unit 130A.

In the present invention, sensors can consist of a plurality of conductive sheets and wires, such as a set of rhombic or square conductive sheets connected together by wires. Structurally, conductive sheets of first sensors 140A and second sensors 140B may be arranged in different or same planes. For example, an insulating or piezoresistive layer can be interposed between first and second sensing layers 120A and 120B, wherein the piezoresistive layer is made from anisotropic conductive gel. Moreover, for example, conductive sheets of first sensors 140A and second sensors 140B are substantially arranged in the same plane, with the wires of first sensors 140A bridging over the wires of second sensors 140B. In addition, pads can be disposed between the wires of first sensors 140A and second sensors 140B. These pads can be made of insulating or piezoresistive materials.

Thus, in an example of the present invention, each sensor is responsible for a sensing range. There are a plurality of sensors, including a plurality of first sensors and a plurality of second sensors. The sensing ranges of these first sensors are parallel to each other, while the sensing ranges of these second sensors are parallel to each other. The parallel sensing ranges of the first and second sensors intersect to form an intersecting matrix. For example, the first and second sensors are two lines of infrared receivers arranged horizontally and vertically for sensing horizontal scanning ranges and vertical scanning ranges, respectively. The horizontal and vertical scanning ranges form an intersecting matrix. The horizontal and vertical scanning ranges are implemented by several lines of intersecting capacitive or resistive sensors.

Conversion of Sensing Information

The signal values, differences and dual differences of the sensing information can be converted into one another. In a first conversion method provided by the present invention, continuous signal values are converted into continuous differences; each difference being the difference between a pair of adjacent or non-adjacent signal values.

In a second conversion method provided by the present invention, continuous signal values are converted into continuous dual differences; each dual difference being the sum or difference between two pairs of signal values.

In a third conversion method provided by the present invention, continuous differences are converted into continuous signal values; each difference is added to all the preceding or following differences to obtain a corresponding signal value, thereby constructing continuous signal values.

In a fourth conversion method provided by the present invention, continuous differences are converted into continuous dual differences; each dual difference is the sum or difference of a pair of adjacent or non-adjacent differences.

In a fifth conversion method provided by the present invention, continuous dual differences are converted into continuous differences; each dual difference is added to all the preceding or following dual differences to obtain a corresponding difference, thereby constructing continuous differences.

In a sixth conversion method provided by the present invention, continuous dual differences are converted into continuous signal values. In an example of the present invention, each dual difference is added to all the preceding dual differences to obtain a corresponding difference, thereby constructing continuous differences, and thereafter each difference subtracts all the following differences to generate a corresponding signal value, thereby constructing continuous signal values. In another example of the present invention, each dual difference subtracts all the preceding dual differences to obtain a corresponding difference, thereby constructing continuous differences, and thereafter each difference is added to all the following differences to generate a corresponding signal value, thereby constructing continuous signal values.

Adding all the preceding or following differences or dual differences to generate a corresponding signal value or difference is performed by forward or backward accumulation.

These conversion methods may include but not limited to the conversion of 1-D sensing information, one with ordinary skill in the art can appreciate that the above conversion methods can be applied to 2-D sensing information or 3-D (or even more dimensional) sensing information. In addition, one with ordinary skill in the art can appreciate that the above conversion methods can be performed by said controller 160 or host 170.

Accordingly, in an example of the present invention, a first form of sensing information (e.g. 1-D or 2-D sensing information) detected is converted into sensing information for position analysis. In another example of the present invention, a first form of sensing information is converted into a second form of sensing information, and then the second form of sensing information is converted into sensing information for position analysis, for example, continuous dual difference is converted to continuous signal values.

One-Dimension Position Analysis

A first type of position analysis provided by the present invention involves analyzing the position of a zero-crossing based on a plurality of differences in sensing information as the corresponding position of an external object. One with ordinary skill in the art can recognize that position analysis may include but not limited to determination of the touch or proximity of an object, that is, determination of a corresponding position of an external object may include but not limited to the touch or proximity of the object.

In an example of the present invention, a pair of neighboring differences including a positive and a negative value is searched, that is, a pair of positive and negative values at both sides of a zero-crossing, and then the position of the zero-crossing in this pair of neighboring differences is then determined, for example, a slope is determined based on this pair of adjacent differences to infer the position of the zero-crossing. In addition, order of the positive and negative values can be used in conjunction for determining the position of the zero-crossing. Said pair of neighboring differences can be directly adjacent to each other, or not adjacent and with at least one zero value between them. In addition, a pair of neighboring differences with a predetermined order of arrangement can be searched for, for example, a pair of neighboring differences with a positive value appearing first and followed by a negative value is searched for.

In another example of the present invention, a threshold is used for determining the starting position of the search. From there, a pair of neighboring differences including a positive and a negative value is searched for, and then the position of a zero-crossing is determined based on the found pair of neighboring differences. One with ordinary skill in the art can appreciate that in the case that sensing information is represented by differences, when sensing information corresponding to the touch or proximity of an external object is above a positive threshold or below a negative threshold, the searching using these threshold values may include but not limited to the determination of the touch or proximity of the external object. In other words, whenever sensing information is above a positive threshold or below a negative threshold, it can be determined that there is a zero-crossing in the sensing information that corresponds to a touch or proximity of an external object.

For example, a threshold generates binary values corresponding to positive differences. For example, a difference smaller than a threshold (e.g. positive threshold) is represented by 0 or false, and a difference larger than the threshold is represented by 1 or true, and the position of a 1 or true in adjacent differences 10 is regarded as the starting position for a backward search of a zero-crossing. Similarly, a difference larger than a threshold (e.g. negative threshold) is represented by 0 or false, and a difference smaller than the threshold is represented by 1 or true, and the position of a 1 or true in adjacent differences 01 is regarded as the starting position for a forward search of a zero-crossing.

Figure 4A:
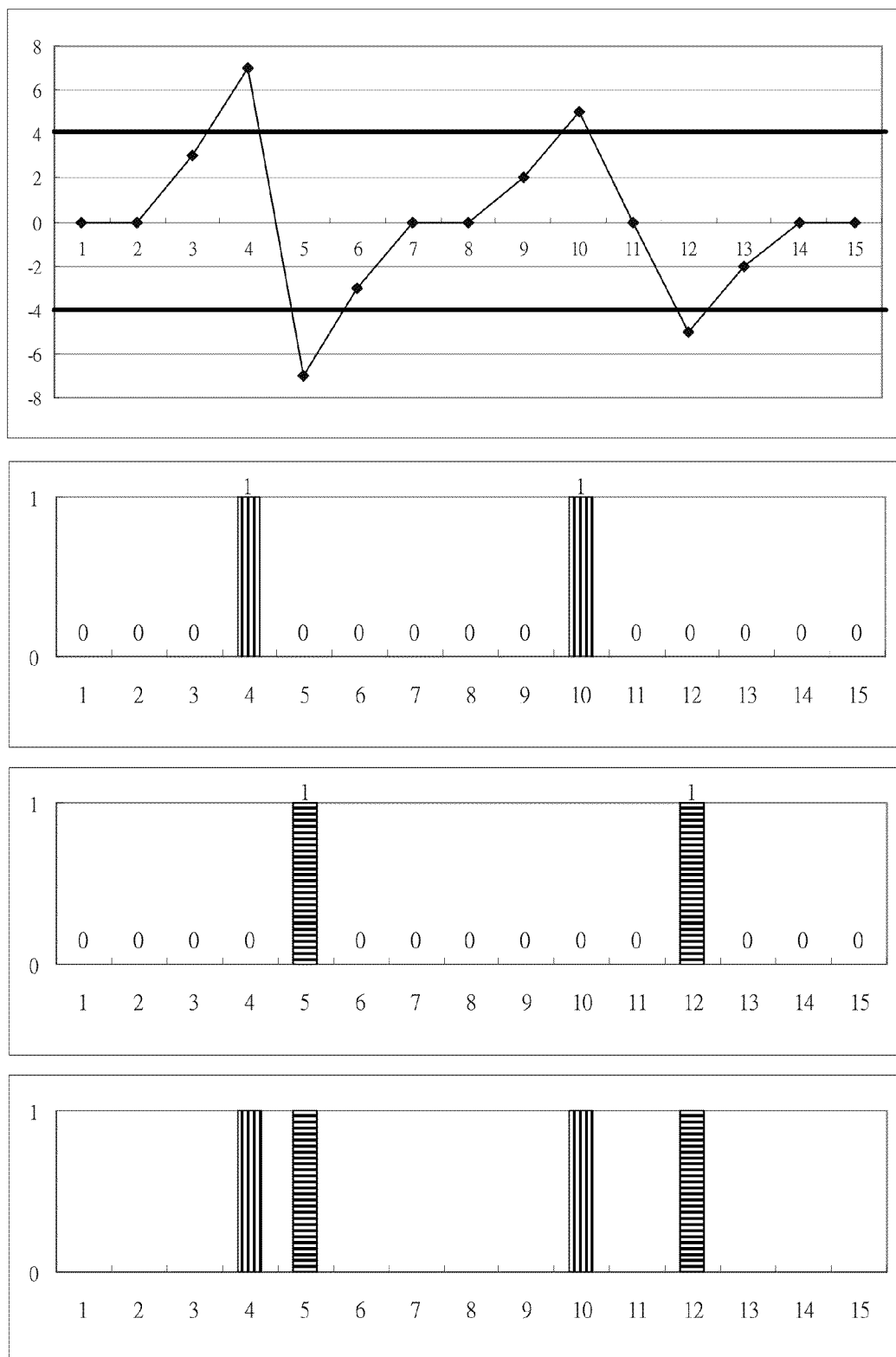
FIG. 4A is a diagram illustrating position detection using binary differences according to the present invention.
Figure 4B:
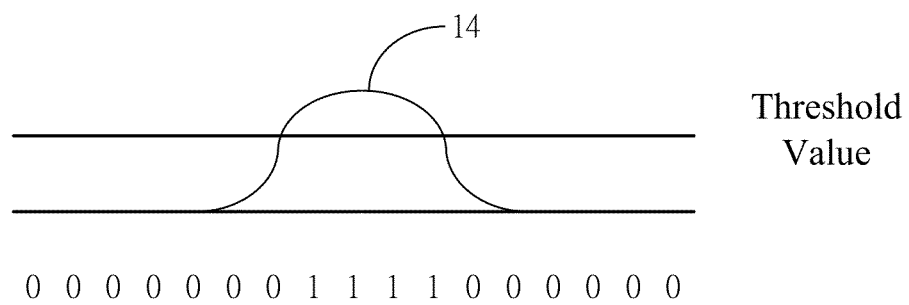
FIGS. 4B to 4D are diagrams illustrating examples for detecting centroid positions according to the present invention.
Figure 4C:
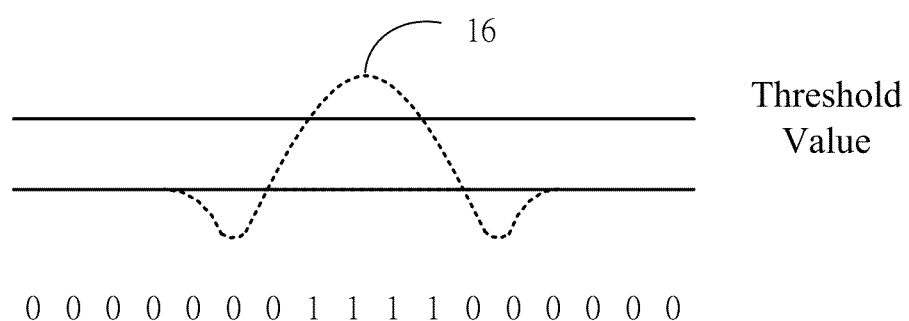

For example, Table 1 and FIG. 4B are examples of using threshold for determining touch or proximity of an external object.

TABLE 1

| Index | Signal Value | Difference | First Binary Difference (T1 = 4) | Second Binary Difference (T2 = −4) |
|---|---|---|---|---|
| 1 | 0 | 0 | 0 | 0 |
| 2 | 0 | 0 | 0 | 0 |
| 3 | 0 | 3 | 0 | 3 |
| 4 | 3 | 7 | 1 | 0 |
| 5 | 10 | −7 | 0 | 1 |
| 6 | 3 | −3 | 0 | 0 |
| 7 | 0 | 0 | 0 | 0 |
| 8 | 0 | 0 | 0 | 0 |
| 9 | 0 | 2 | 0 | 0 |
| 10 | 2 | 5 | 1 | 0 |
| 11 | 7 | 0 | 0 | 0 |
| 12 | 7 | −5 | 0 | 1 |
| 13 | 2 | −2 | 0 | 0 |
| 14 | 0 | 0 | 0 | 0 |
| 15 | 0 | 0 | 0 | 0 |

This example includes signal values or difference of 15 sensors and determination results using a positive threshold T1 (e.g. 4) and a negative threshold T2 (e.g. −4). In the determination results using the positive threshold, the starting positions are the 4th and 10th differences, that is, the position of a 1 in adjacent differences 10. In the diagram with vertical-stripe bar, it is found that there are two instances of touch or proximity of external objects. Similarly, in the determination results using the negative threshold, the starting positions are the 5th and 12th differences, that is, the position of a 1 in adjacent differences 01. In the diagram with horizontal-stripe bar, it is found that there are two instances of touch or proximity of external objects. One with skill the art can appreciate that the number of starting position corresponds to the number of instances of touch or proximity of external objects. The present invention does not limit to only two instances of touch or proximity of external objects, but there can be more.

In another example of the present invention, an interval for a zero-crossing is determined using a first threshold and a second threshold, which may include but not limited to touch or proximity of an external object, and then the position of the zero-crossing is searched within this interval. For example, a first threshold produces binary values of positive differences, for example, a difference smaller than the first threshold is represented by 0 or false, and a difference larger than the first threshold is represented by 1 or true, and the position of a 1 in adjacent differences 10 is regarded as the starting position. In addition, a second threshold produces binary values of negative differences, for example, a difference larger than the second threshold is represented by 0 or false, and a difference smaller than the second threshold is represented by 1 or true, and the position of a 1 in adjacent differences 01 is regarded as the end position. Moreover, the starting and end positions are paired to form intervals for searching zero-crossings. In an example of the present invention, a slope is used to determine the zero-crossing between a starting position (e.g. position of a 1 in 10) and an end position (e.g. position of a 1 in 01). One with ordinary skill in the art can appreciate that the starting and end positions are interchangeable. One with ordinary skill in the art can appreciate that touch related sensing information can be determined by regarding the location of 1 in 01 as the starting position and the location of 1 in 10 as the end position.

Take again the example shown in FIG. 4A and Table 1, after pairing, a first search interval is between the 4th and 5th differences, and a second search interval is between the 10th and 12th differences.

One with ordinary skill in the art can appreciate that positive and negative thresholdings can be performed simultaneously (or in parallel). Interval pairing can be carried out by pairing a determined starting position with an end position that determined immediately afterwards.

In an example of the present invention, thresholds can be generated by sensing information. For example, a threshold value can be determined by multiplying a maximum of the absolute values of all differences by a ratio (e.g. a ratio smaller than one, such as 0.9), or a positive threshold value can be determined by multiplying a maximum of all positive differences by a ratio, or a negative threshold value can be determined by multiplying a minimum of all negative differences by a ratio. In other words, a threshold value can be static or dynamic. Thus, when the absolute value of a threshold is relatively large, it is possible that external object is determined when using the positive thresholding but not in the negative thresholding, or vice versa. A larger threshold value is favorable for noise or ghost points filtering, while a smaller threshold value is favorable for avoiding miss of real touch or for determining approaching of external objects.

From the above, it is clear that, corresponding to the same touch or approaching of an object, regardless of a backward search from a starting position identified using a positive threshold value or a forward search from a starting position identified using a negative threshold value, the same zero-crossing will be searched. Thus, in an example of the present invention, search for a zero-crossing starts from starting positions identified using positive and negative threshold values, and the number of external touch or approaching is determined based on the number of zero-crossings found, and then the positions of the zero-crossings are determined. When the values at both sides of a zero-crossing that corresponds to an external touch or approaching are first positive and then negative, the search for zero-crossing is backward from the starting position when using positive thresholding, whereas the search for zero-crossing is forward from the starting position when using negative thresholding, and vice versa. In addition, an external touch or approaching may not always exhibit starting positions in both positive and negative thresholdings.

A second type of position analysis provided by the present invention involves analyzing the position of centroid (position of center of weight or weighted average position) based on a plurality of signal values or dual differences in sensing information as the corresponding position of an external object.

Figure 4D:
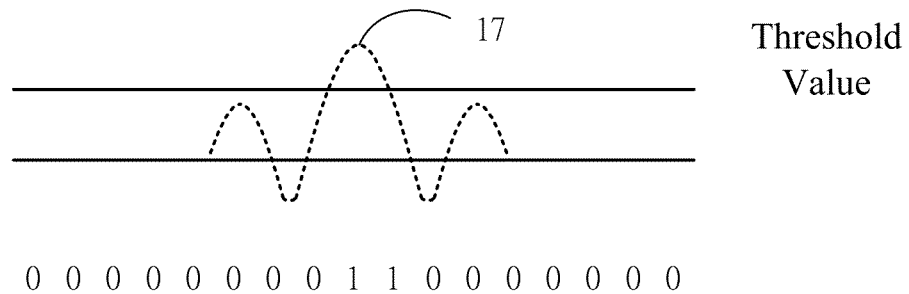

In an example of the present invention, a threshold value is used to determine the centroid position of signal values or dual differences, as shown in FIGS. 4B and 4D. A threshold can generate binary values corresponding to signal values or dual differences. For example, a signal value or dual difference smaller than a threshold is represented by 0 or false, and a signal value or dual difference larger than the threshold is represented by 1 or true. In this example, a signal value or dual difference represented by 1 or true is used in determining centroid position. One with ordinary skill in the art can appreciate other ways for determining a centroid position of signal values or dual differences using a threshold. For example, a signal value or dual difference represented by 1 or true, as well as a plurality of signal values or dual differences at either side thereof, are used in determining centroid position. As another example, in a continuous series of adjacent signal value or dual difference represented by 1 or true, a number (i) of and a number (j) of signal values or dual differences before and after a signal value or dual difference that is at the center of the series are taken to determine the centroid position.

In another example of the present invention, continuous signal values or dual differences are converted into continuous differences to identify the center signal value or dual difference that corresponds to a zero-crossing, and i and j signal values or dual differences before and after the center signal value or dual difference are used for determining the centroid position.

In another example of the present invention, a zero-crossing is determined by continuous differences, and the continuous differences are converted into continuous signal values or dual differences, and then the center signal value or dual difference that corresponds to the zero-crossing is identified, thereafter, i and j signal values or dual differences before and after the center signal value or dual difference are used for determining the centroid position.

Assuming that using i and j signal values respectively before and after the nth signal value as a centroid calculation range, the centroid position can be determined based on each signal value $C_k$ and its position in the centroid calculation range as follows:

$$C_{centroid} = \frac{\sum_{k=n-i}^{n+j} X_k C_k}{\sum_{k=n-i}^{n+j} C_k}$$

wherein $X_k$ can be a 1-D coordinate (e.g. X or Y coordinate) or 2-D coordinates (e.g. (X, Y)).

Assuming the difference between the k−1th signal value and the kth signal value is $D_k$, and the kth dual difference is $DD_k = D_{k-1} - D_k = (C_k - C_{k-1}) - (C_{k+1} - C_k) = 2C_k - C_{k-1} + C_{k+1}$, and assuming using i and j signal values respectively before and after the nth dual difference $DD_n$ as a centroid calculation range, the centroid position can be determined based on each dual difference $DD_k$ in the centroid calculation range as follows:

$$DD_{centroid} = \frac{\sum_{k=n-i}^{n+j} X_k DD_k}{\sum_{k=n-i}^{n+j} DD_k}$$

wherein $X_k$ can be a 1-D coordinate (e.g. X or Y coordinate) or 2-D coordinates (e.g. (X,Y)). One with ordinary skill in the art can similarly appreciate the calculation for centroid position when the kth dual difference is $DD_k = (C_k - C_{k-2}) - (C_{k+2} - C_k) = 2C_k - C_{k-2} + C_{k+2}$. This will not be described further.

In another example of the present invention, signal values or dual differences used for determining centroid position is obtained by first subtracting a base value. For example, this base value can be the average of all signal values or dual differences, the average of a plurality of signal values or dual differences at either sides of the signal values or dual differences used for centroid position determination, or the average of a plurality of signal values or dual differences not used for centroid position determination that are adjacent to either sides of the signal values or dual differences used for centroid position determination. One with ordinary skill in the art can recognize other ways of determining the base value. For example, the base value can be determined based on a first ratio of at least one signal value or dual difference at one side and a second ratio of at least one signal value or dual difference at the other side.

Taken the average of the ith signal value $C_{n-i}$ and the jth signal value $I_{n+j}$ respectively before and after the nth signal value as base value $$C_{base(i,j)}\left(C_{base(i,j)} = \frac{C_{n-i} + C_{n+j}}{2}\right),$$

and using i and j signal values respectively before and after the nth signal value as a centroid calculation range, the centroid position can be determined based on each signal value $C_k$ minus the base value $C_{base(i,j)}$ in the centroid calculation range as follows:

$$C_{base(i,j)} = \frac{C_{n-i} + C_{n+j}}{2}$$

$$C_k - C_{base(i,j)} = \frac{2C_k - C_{n-i} - C_{n+j}}{2} = \frac{(C_k - C_{n-i})}{2} + \frac{(C_k - C_{n+j})}{2}$$

$$C_{cnetroid} = \frac{\sum_{k=n-i}^{n-i\leq k\leq n+j} X_k\left(\frac{2C_k - C_{n-i} - C_{n+j}}{2}\right)}{\sum_{k=n-i}^{n-i\leq k\leq n+j} \frac{2C_k - C_{n-i} - C_{n+j}}{2}} = \frac{\sum_{k=n-i}^{n-i\leq k\leq n+j} X_k(2C_k - C_{n-i} - C_{n+j})}{\sum_{k=n-i}^{n-i\leq k\leq n+j} (2C_k - C_{n-i} - C_{n+j})}$$

wherein $X_k$ can be a 1-D coordinate (e.g. X or Y coordinate) or 2-D coordinates (e.g. (X, Y)).

A third type of position analysis provided by the present invention involves analyzing the position of centroid (position of center of weight or weighted average position) based on a plurality of differences in sensing information as the corresponding position of an external object.

Assuming the difference between the k-1th signal value $C_{k-1}$ and the kth signal value $C_k$ is $D_k$.

$$(C_k - C_{n-i}) = D_{n-(i-1)} + D_{n-(i-2)} + \ldots + D_k$$

$$(C_k - C_{n+j}) = -(D_{k+1} + D_{k+2} + \ldots + D_{n+j})$$

$$C_k - C_{base(i,j)} = \frac{2C_k - C_{n-i} - C_{n+j}}{2} = \frac{(D_{n-(i-1)} + D_{n-(i-2)} + \ldots + D_k) - (D_{k+1} + D_{k+2} + \ldots + D_{n+j})}{2}$$

$$C_k - C_{base(i,j)} = \frac{\sum_{s=n-(i-1)}^{k} D_s - \sum_{s=k+1}^{n+j} D_s}{2}$$

$$C_{cnetroid} = \frac{\sum_{s=n-i}^{n-i\leq k\leq n+j} X_s\left(\frac{\sum_{s=n-(i-1)}^{k} D_s - \sum_{s=k+1}^{n+j} D_s}{2}\right)}{\sum_{s=n-i}^{n-i\leq k\leq n+j} \frac{\sum_{s=n-(i-1)}^{k} D_s - \sum_{s=k+1}^{n+j} D_s}{2}} =$$

$$\frac{\sum_{s=n-i}^{n-i\leq k\leq n+j} X_k\left(\sum_{s=n-(i-1)}^{k} D_s - \sum_{s=k+1}^{n+j} D_s\right)}{\sum_{s=n-i}^{n-i\leq k\leq +j} \left(\sum_{s=n-(i-1)}^{k} D_s - \sum_{s=k+1}^{n+j} D_s\right)}$$

Accordingly, the centroid position $C_{centroid}$ can be calculated based on the differences between the signal values, wherein the differences in the centroid calculation range are $D_{n-(i-1)}, D_{n-(i-2)}, \ldots, D_k, D_{k+1}, \ldots, D_{n+j}, D_{n+(j+1)}$. In other words, the centroid position $C_{centroid}$ can be calculated based on the differences in the centroid calculation range.

As an example, assuming 1 signal value before and after the nth signal value are taken for determining the centroid position, differences in the centroid calculation range can be used to calculate it. This is proven as follows:

$$D_{n-1} = C_{n-1} - C_{n-2}$$

$$D_n = C_n - C_{n-1}$$

$$D_{n+1} = C_{n+1} - C_n$$

$$D_{n+2} = C_{n+2} - C_{n+1}$$

$$C_{base(2,2)} = \frac{C_{n-2} + C_{n+2}}{2}$$

$$C_{n-1} - C_{base(2,2)} = \frac{2C_{n-1} - C_{n-2} - C_{n+2}}{2} = \frac{D_{n-1} - D_{n+1} - D_{n+2}}{2}$$

$$C_n - C_{base(2,2)} = \frac{2C_n - C_{n-2} - C_{n+2}}{2} = \frac{D_{n-1} + D_n - D_{n+1} - D_{n+2}}{2}$$

$$C_{n+1} - C_{base(2,2)} = \frac{2C_{n+1} - C_{n-2} - C_{n+2}}{2} = \frac{D_{n-1} + D_n + D_{n+1} - D_{n+2}}{2}$$

$$C_{centroid} = \frac{X_{n-1}\left(\begin{array}{c}C_{n-1} - \\ C_{base(2,2)}\end{array}\right) + X_n\left(\begin{array}{c}C_n - \\ C_{base(2,2)}\end{array}\right) + X_{n+1}(C_{n+1} - C_{base(2,2)})}{(C_{n-1} - C_{base(2,2)}) + (C_n - C_{base(2,2)}) + (C_{n+1} - C_{base(2,2)})}$$

-continued $$C_{centroid} = \left( X_{n-1} \frac{(D_{n-1} - D_n -}{D_{n+1} - D_{n+2})} + \right.$$
$$X_n \frac{(D_{n-1} + D_n -}{D_{n+1} - D_{n+2})} + X_{n+1} \frac{(D_{n-1} + D_n +}{D_{n+1} - D_{n+2}))} \bigg/ \frac{((D_{n-1} - D_n -}{D_{n+1} - D_{n+2})} +$$
$$\left. \frac{(D_{n-1} + D_n -}{D_{n+1} - D_{n+2})} + \frac{(D_{n-1} + D_n +}{D_{n+1} - D_{n+2}))} \right)$$

One with ordinary skill in the art can recognize that taking i and j signal values, differences or dual differences respectively before and after the nth signal value as the centroid calculation range can be applied to determine the signal value, difference or dual difference on the centroid position.

From the above description, it can be seen that the present invention performs position detection by analyzing sensing information that may not only include originally obtained signal values, differences, or dual differences, but also signal values, differences, or dual differences converted from originally obtained sensing information. By analyzing 1-D or 2-D sensing information on two difference axes (e.g. X and Y axes) that corresponds to the same object, that is, by performing 1-D or 2-D position analysis on two different axes, the positions (or coordinates) of the object on these two axes can be obtained, thereby a 2-D position (or 2-D coordinates) can be constructed.

One with ordinary skill in the art can appreciate that operations of the above 1-D position analysis can be performed by said controller 160 or host 170.

Two-Dimension Position Analysis

2-D sensing information can be comprised of a plurality of 1-D sensing information, wherein each 1-D sensing information includes sensing information that corresponds to a plurality of first 1-D positions, and each 1-D sensing information corresponds to a second 1-D position. Thus, 2-D position analysis can at least include 1-D position analysis on a plurality of 1-D touch sensitive information, that is, 2-D position analysis can at least include a plurality of 1-D position analysis.

In addition, in a first example of the present invention, a first 1-D centroid position of any external object on each first dimensional sensing information is a 2-D position (e.g. 2-D coordinates (first 1-D centroid position, second 1-D position of the first dimensional sensing information)), and can be used to calculate a 2-D centroid position of the object (or center of geometry), wherein the weight of each 1-D centroid position can be a signal value or dual difference of the external object on the corresponding first dimensional sensing information (e.g. one or average or interpolation of two signal values or dual differences closest to the 1-D centroid position on the first dimensional sensing information), or sum of signal values or dual differences of the external object on the corresponding first dimensional sensing information.

Thus, 2-D position analysis can perform 1-D position analysis on each first dimensional sensing information, and analyze a 2-D centroid position of each external object based on at least one 2-D position that corresponds to each external object.

In addition, in a second example of the present invention, 2-D position analysis may include performing 1-D position analysis on a plurality of 1-D sensing information on a first axis (or a first dimension), respectively, and based on at least one 1-D position corresponding to each external object on the first axis, analyzing a first 1-D centroid position of each external object on the first axis. Similarly, 2-D position analysis may further include performing 1-D position analysis on a plurality of 1-D sensing information on a second axis (or a second dimension), respectively, and based on at least one 1-D position corresponding to each external object on the second axis, analyzing a second 1-D centroid position of each external object on the second axis. By pairing the first 1-D centroid position on the first axis with the second 1-D centroid position on the second axis for each external object, a 2-D position for each external object can be analyzed.

In other words, 2-D position analysis may include performing 1-D position analysis on 2-D sensing information on two different axes (e.g. 2-D sensing information on the first axis and 2-D sensing information on the second axis) to obtain a 2-D position for each external object.

In addition, in a third example of the present invention, 2-D position analysis may include analyzing 1-D centroid position corresponding to each external object from a plurality of 1-D sensing information on a first axis, and based on a 2-D position corresponding to each 1-D sensing information, determining a 2-D position of each 1-D centroid position that corresponds to each external object on the first axis. 2-D position analysis may further include analyzing 1-D centroid position corresponding to each external object from a plurality of 1-D sensing information on a second axis, and based on a 2-D position corresponding to each 1-D sensing information, determining a 2-D position of each 1-D centroid position that corresponds to each external object on the second axis. 2-D position analysis may further include analyzing a 2-D centroid position based on the 2-D positions of all 1-D centroid positions on the first and second axes that correspond to each external object.

One with ordinary skill in the art can appreciate that 2-D sensing information can determine the position of each external object by image processing, for example, using watershed or other image processing techniques. As another example, watershed algorithm can be used to analyze the position of each watershed, and then the centroid position is calculated using sensing information near each watershed position to obtain a more accurate position.

In a fourth example of the present invention, a plurality of 1-D sensing information originally obtained can be represented by signal values or dual differences, which construct an image (or matrix) formed from 2-D sensing information. Watershed algorithm or other image processing techniques can be used for position analysis. Alternatively, a "connected component" algorithm can be used, which analyzes connected portions in an image to determine an image of each external object, and further determines the position or the type of the object, such as a finger, a palm or a pen.

In a fifth example of the present invention, a plurality of 1-D sensing information originally obtained can be represented by differences, which are then converted into signal values or dual differences, which in turn construct an image (or matrix) formed from 2-D sensing information. Watershed algorithm or other image processing techniques can be used for position analysis.

In a sixth example of the present invention, a plurality of 1-D sensing information originally obtained can be represented by differences. By performing position analysis on each 1-D sensing information, the position of each zero-crossing, as well as the signal value or dual difference on the position of each zero-crossing can be determined, thereby constructing an image (or matrix) formed from 2-D sensing information. Watershed algorithm or other image processing techniques can be used for position analysis.

The dual difference of a zero-crossing point can be generated by two directly adjacent differences, for example, a zero-crossing is between the k−1th difference and the kth difference, and the dual difference at this zero-crossing point is $DD_k = D_{k-1} - D_k$. The signal value of a zero-crossing point can be generated after converting all differences representing the 1-D sensing information into signal values, or generated based on a plurality of differences closest to the zero-crossing. For example, zero-crossing is closest to the nth signal value, and the average of ith signal value $C_{n-i}$ and the jth signal value $I_{n+j}$ before and after the nth signal value is taken as the base value $$C_{base(i,j)}\left(C_{base(i,j)} = \frac{C_{n-i} + C_{n+j}}{2}\right),$$

and $$C_n - C_{base(i,j)} = \frac{2C_n - C_{n-i} - C_{n+j}}{2}$$

is taken as the signal value, then $$C_n - C_{base(i,j)} = \frac{2C_n - C_{n-i} - C_{n+j}}{2} = \\ \frac{(D_{n-(i-1)} + D_{n-(i-2)} + \ldots + D_n) - (D_{n+1} + D_{n+2} + \ldots + D_{n+j})}{2}.$$

In other words, between the n−(i−1)th difference to the (n+j)th difference, the signal value at zero-crossing can be determined.

In a seventh example of the present invention, a plurality of 1-D sensing information originally obtained can be represented by signal values and dual differences and are then converted to differences. By performing analysis on each 1-D sensing information, the position of each zero-crossing is determined. In conjunction with the signal value or dual difference on each zero-crossing position, an image (or matrix) formed by 2-D sensing information can be constructed. Watershed algorithm or other image processing techniques can be used for position analysis.

In an eighth example of the present invention, when or in the process of obtaining 2-D sensing information on the first axis, 1-D sensing information on the second axis is also obtained. After performing position analysis on the position of the 2-D sensing information on the first axis, the 1-D position or 2-D position of each external object on the first axis can be obtained. In addition, after performing position analysis on the position of the 2-D sensing information on the second axis, the 1-D position of each external object on the second axis can be obtained. The 1-D position on the second axis can be paired up with the 1-D position on the first axis to form a 2-D position, or can be used to replace or correct the position on the second axis in the 2-D position on the first axis.

One with ordinary skill in the art can appreciate that the operations of the above 2-D position analysis can be performed by said controller 160 or host 170. In addition, in an example of the present invention, the 1-D distance or 2-D distance between each 1-D centroid position corresponding to the same touch or approach and at least one other 1-D centroid position corresponding to the same touch or approach is within a threshold. In another example of the present invention, the weight of each 1-D centroid position corresponding to the same touch or approach is greater than a threshold.

In the following description, a touch related sensing information can be a touch related sensing information or one of multiple touch related sensing information in a sensing information. Operations related to touch related sensing information can be applied not only to specific touch related sensing information but also to all touch related sensing information of the present invention.

In an example of the present invention, the position of a zero-crossing can be determined by a pair of positive and negative values. The zero-crossing is between a positive and a negative value. From the positive and negative values and their positions, a slope can be determined, which can be used to estimate the position of the zero-crossing, that is, the position of a line connecting between the positive and negative values at the zero value is determined based on the slope.

Figure 5A:
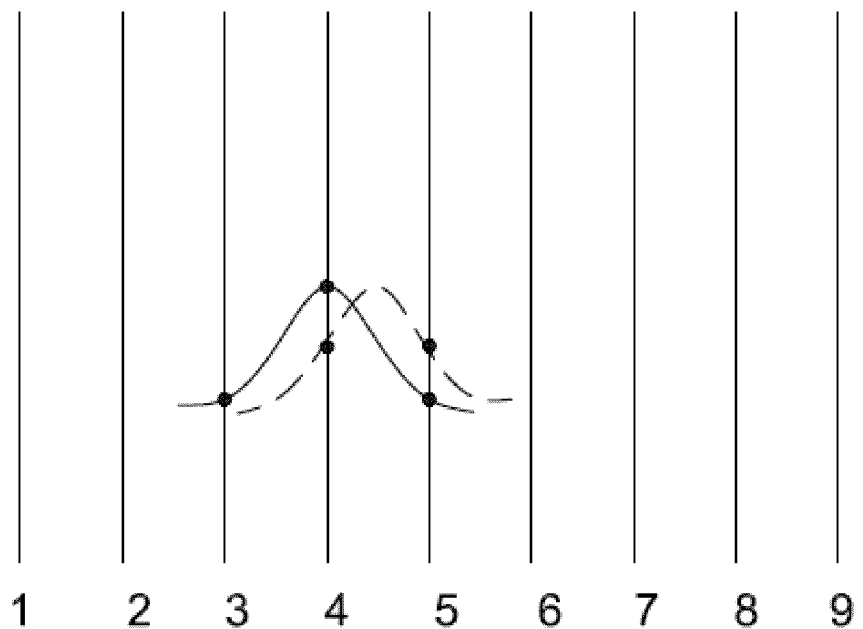
FIGS. 5A to 5G are diagrams illustrating non linearity of a touch trace.

Since sensors on a touch panel are not densely disposed, i.e. there are gaps between the sensors, as shown in FIG. 5A (in a single dimension, for example). Thus, when a finger touches a fourth sensor on the touch panel, a corresponding touch related sensing information is detected (solid line). Meanwhile, the signal value detected by the fourth sensor is the maximum value, which is also the peak of this touch related sensing information.

Thereafter, when the finger gradually moves to the right, it will press against a position without any disposed sensor, e.g. between the fourth and fifth sensors. The touch related sensing information detected now is as shown by the dotted line. The peak of the touch related sensing information cannot be directly detected by the sensors, but position detection is required to calculate the position of the waveform peak. Since the sensors are not densely disposed, when a finger moves on a touch panel in a constant velocity in a certain dimension (X or Y direction), the touch panel displays the path of the moving finger in a non-constant velocity.

Figure 5G:
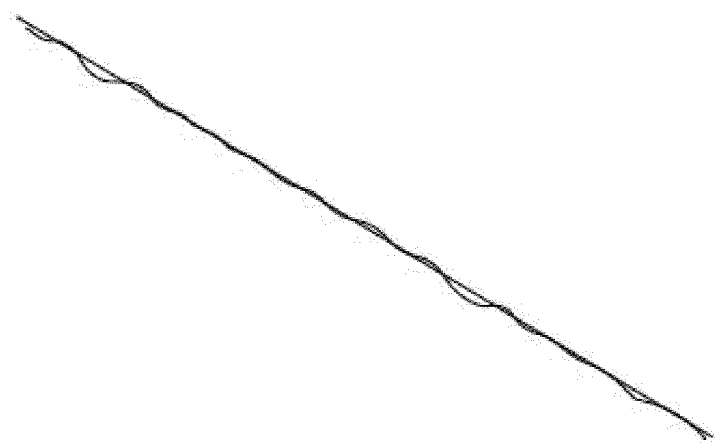
Figure 5B:
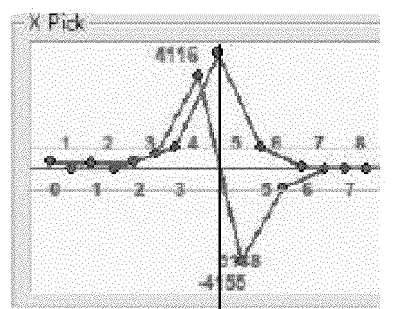

As shown in FIGS. 5B to 5F, signal values and signal differences retrieved every certain time unit are shown, wherein a solid line indicates zero-crossing movement when a finger moves from the fourth sensor to the fifth sensor, and a dotted line indicates the signal values actually detected by the sensors. In FIG. 5B, the finger presses exactly on the fourth sensor, at this moment, the zero-crossing calculated position and the actual position detected by the sensors are both on the fourth sensor. Thereafter, as shown in FIGS. 5C to 5F, when the finger gradually moves to the right, since the sensors are not densely disposed, actual signal values detected by the sensors cannot measure a signal peak, the slope of the waveform in the signal difference waveform graph also changes as a result, causing the calculated zero-crossing to move to the right in a non-constant velocity.

Figure 5C:
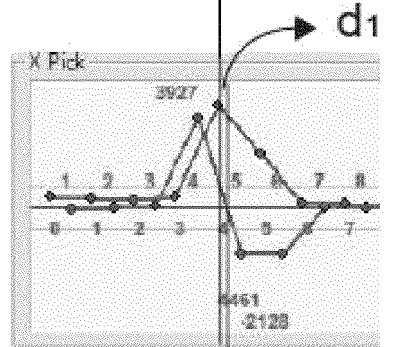
Figure 5D:
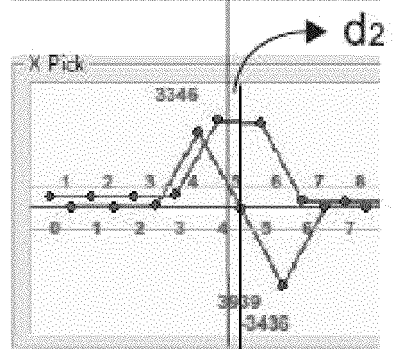
Figure 5E:
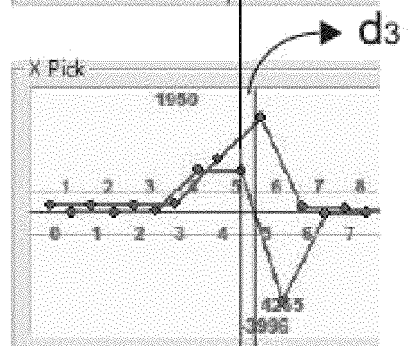
Figure 5F:
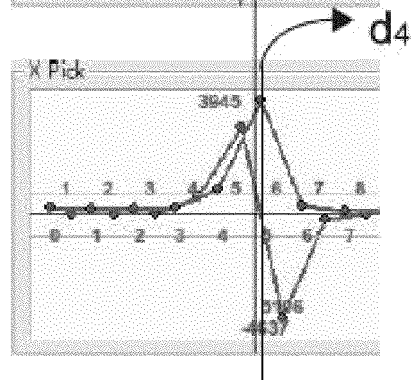

In FIG. 5C, the zero-crossing position moves from the fourth sensor to the right by $d_1$. Thereafter, in FIG. 5D, the zero-crossing position moves further to the right by $d_2$. Then, in FIG. 5E, the zero-crossing position moves further to the right by $d_3$. Finally, in FIG. 5F, the zero-crossing position moves further to the right by $d_4$ to the fifth sensor. Obviously, $d_1$, $d_2$, $d_3$, and $d_4$ are all different in length. Thus, the line will be displayed on a single dimensional touch panel in a non-constant velocity. When lines in the X and Y directions are both displayed in non-constant velocities, the result of drawing a slant line using a finger on the touch panel is a non-linearly displayed path of the finger on the touch panel. As shown in FIG. 5G, the straight line is the actual path of the finger, and the wiggled line indicates a non linearity in displaying the moving finger trace on the touch panel.

Therefore, the present invention further provides a method for linear path calculation to solve the problem described above. First, an initial touch related sensing information detected by the sensors is converted into differential touch-related sensing information, which is then converted back into a touch related sensing information consisting of a plurality of signal values. A calculation of the position of a centroid or geometric center is performed based on touch related sensing information consisting of the plurality of signal values to obtain the coordinates of the finger touch at each time point. The trace formed by the coordinates calculated using this method may reduce the non linearity caused by the sparsely disposed sensors.

Figure 6A:
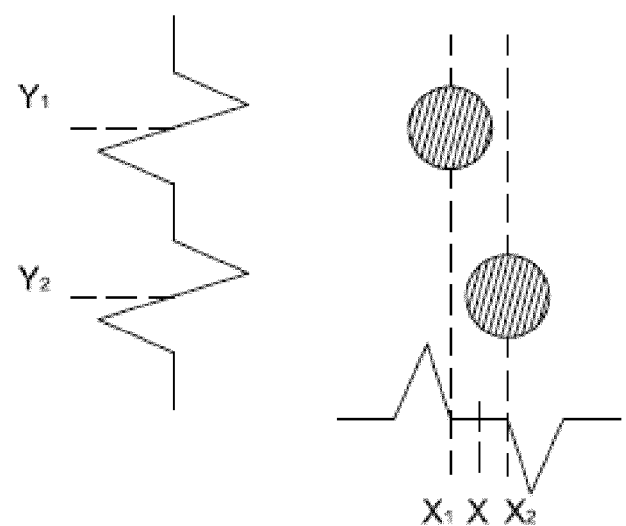
FIGS. 6A and 6B are exemplary diagrams according to the position detection of the present invention.

However, when the distance between two fingers touching a touch panel is very small, signals of these two fingers will interfere with each other, also causing non linearity. First, for detection of coordinates of a certain dimension that is not accurately enough, the present invention provides a method for position detection. As shown in FIG. 6A, when the distance between two fingers on the horizontal axis is very small, a zero-crossing detected on the horizontal axis is only at a first 1-D position X. Thus, the method for coordinates calculation provided by the present invention using second 1-D positions $Y_1$ and $Y_2$ on a dimension (the vertical axis in this embodiment) having accurate coordinates to obtain corresponding first 1-D (the horizontal axis in this embodiment) positions X1 and X2 by mutual-capacitance detection. Accordingly, 2-D positions (X1, Y1) and (X2, Y2) can be formed as accurate coordinates indicating the two fingers as shown in FIG. 6A.

Figure 6B:
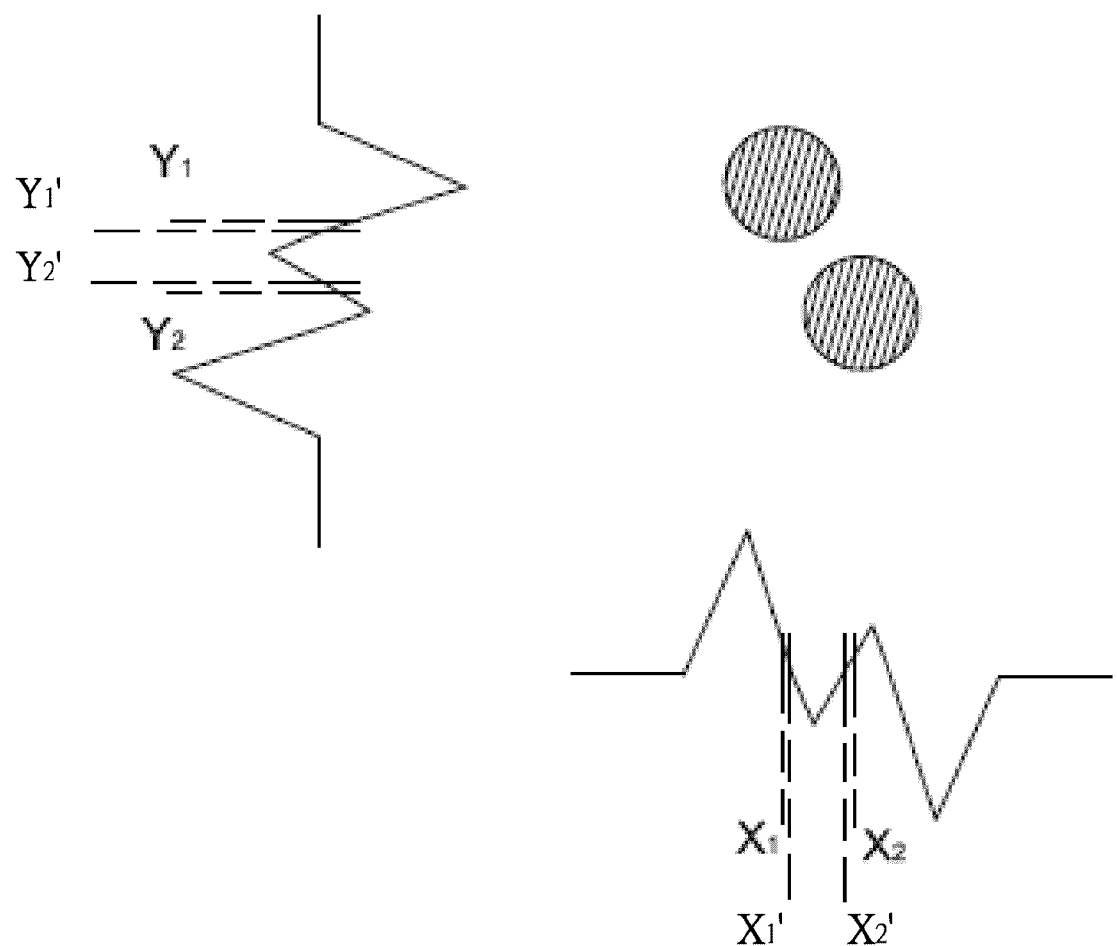

Moreover, when the distances between two fingers on two dimensions are very small, as shown in FIG. 6B, zero-crossings on horizontal axis $X_1$ and $X_2$ and zero-crossings on vertical axis $Y_1$ and $Y_2$ can be determined. However, since the two fingers are too close to each other, detected signals interfere with each other, rendering (X1, Y1) and (X2, Y2) not accurate.

Therefore, the present invention provides another method for position detection to reduce non linearity caused by signal interference, such as that shown in FIG. 6B. First, a first 1-D (e.g. the horizontal (X) axis) first position (X1, X2) is detected by first dimensional self-capacitance detection. Then, mutual-capacitance detection is performed on a sensor corresponding to the first 1-D first position of to detect a second 1-D (e.g. the vertical (Y) axis) second position ($Y_1'$, $Y_2'$). Then, mutual-capacitance detection is performed on a sensor corresponding to the second 1-D second position to detect the first 1-D third position (X1', X2').

Alternatively, self-capacitance detection is performed on a first 1-D and a second 1-D sensor to obtain a first 1-D and a second 1-D first position (e.g. X1, X2, Y1, Y2), and then mutual-capacitance detection is performed on the sensors corresponding to the first 1-D and the second 1-D first positions to detect the second 1-D and the first 1-D (Y1', Y2', X1', X2') second coordinates.

In the best mode, referring to FIG. 7A, a method for position detection is provided by a first embodiment of the present invention. First, in step 710, a sensing device with a plurality of sensors is provided. These sensors include a plurality of first sensors and a plurality of second sensors intersecting each other at a plurality of intersecting points. Then, in step 720, at least a first 1-D position corresponding to at least one external touch is determined based on signals of these first sensors using self-capacitance detection. Thereafter, in step 730, at least a second 1-D position corresponding to the at least one first 1-D position is determined based on signals of these second sensors using mutual-capacitance detection.

Figure 7B:
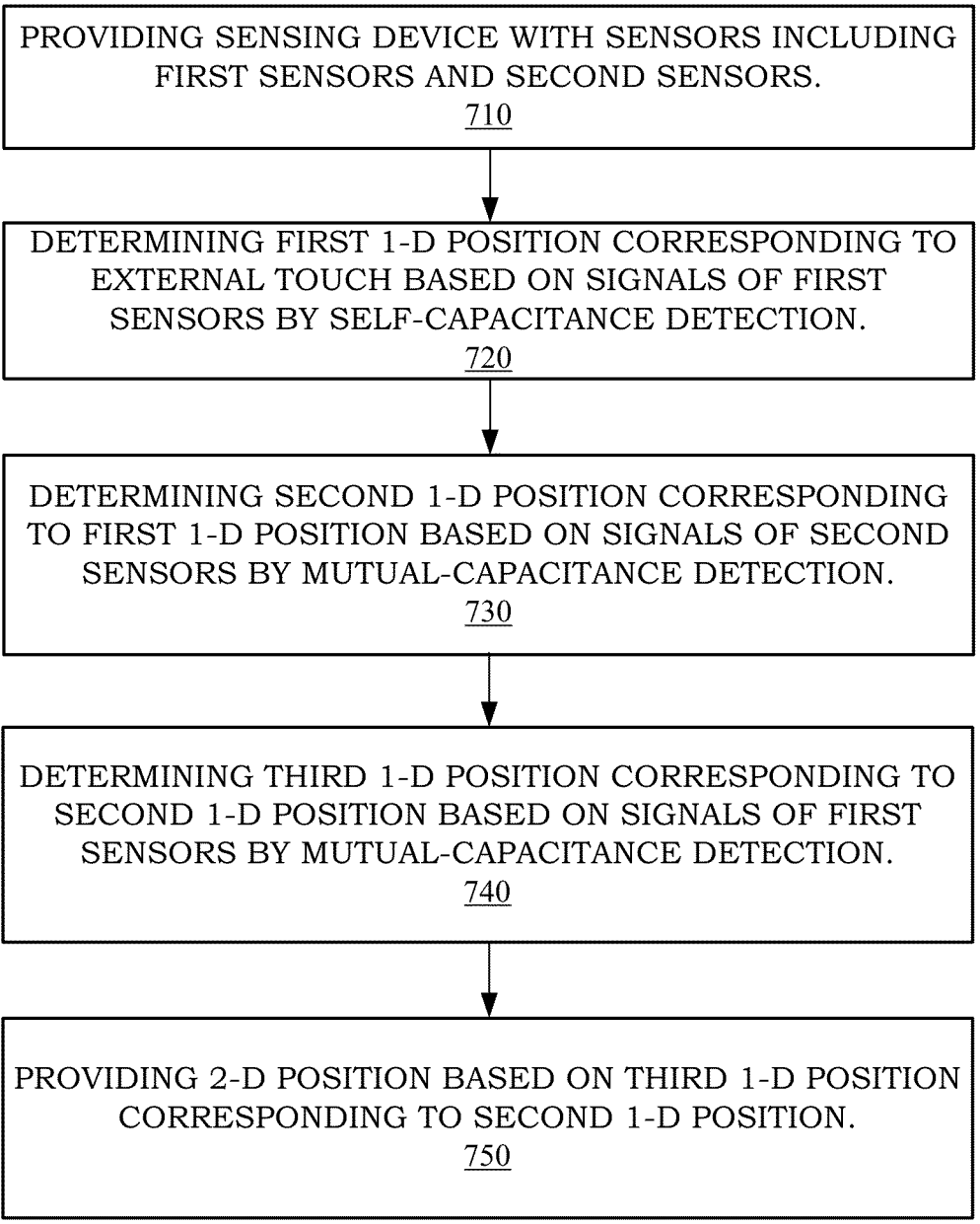

In an example of the present invention, referring to FIG. 7B, at least one third 1-D position corresponding to the at least one second 1-D position is determined based on signals of these first sensors using mutual-capacitance detection, as described in step 740. Then, at least one 2-D position is provided based on the at least one third 1-D position corresponding to the at least one second 1-D position, as described in step 750. For example, as shown in FIG. 6A, X can be determined based on signals of these sensors using self-capacitance detection, and then positions Y1 and Y2 corresponding to position X is determined based on signals of the second sensors using mutual-capacitance detection. Thereafter, position X1 corresponding to position Y1 and position X2 corresponding to position Y2 are then determined based on signals of the first sensors based on mutual-capacitance detection. Accordingly, 2-D positions (X1, Y1) and (X2, Y2) can be provided.

The self-capacitance detection can be achieved by providing a driving signal to these first sensors and providing signals of these sensors. As mentioned before, 1-D sensing information can be generated based on signals of these first sensors, for example, sensing information consisting of a plurality of signal values, differences, or dual differences. According to the previous position analysis, when at least an external object touches or approaches the sensing device, at least one first 1-D position corresponding to the external touch can be analyzed.

Furthermore, when performing mutual-capacitance detection, at least one first sensor provided with the driving signal can be selected based on the at least one first 1-D position. Every time one of the selected first sensors is provided with the driving signal, signals of the second sensors are provided to generate 1-D sensing information based on signals on all intersecting points on the first sensors provided with the driving signal. Based on the generated 1-D sensing information, when at least one external object touches or approaches the sensing device, at least one second 1-D position corresponding to the at least one first 1-D position can be analyzed.

Similarly, at least one second sensor provided with the driving signal can be selected based on the at least one second 1-D position. Every time one of the selected second sensors is provided with the driving signal, signals of the second sensors are provided to generate 1-D sensing information based on signals on all intersecting points on the second sensors provided with the driving signal. Based on the generated 1-D sensing information, when at least one external object touches or approaches the sensing device, at least a third 1-D position corresponding to the at least one second 1-D position can be analyzed.

In an example of the present invention, the first sensors described in step 720 can be fixed, e.g. fixed to be sensors on a first axis or sensors on a second axis.

In another example of the present invention, the first sensors can be selected from sensors on the first axis or sensors on the second axis. Self-capacitance detection can include providing driving signals to the sensors on the first and second axes to generate a first 1-D sensing information and a second 1-D sensing information, and further determining at least one fourth 1-D position and at least one fifth 1-D position corresponding to at least one external touch. Said at least one first 1-D position is the at least one fourth 1-D position or the at least one fifth 1-D position. For example, the at least one fourth 1-D position or the at least one fifth 1-D position that is greater in number is selected as the at least one first 1-D position. If both the at least one fourth 1-D position or the at least one fifth 1-D position have the same number of sensors, then one of the at least one fourth 1-D position or the at least one fifth 1-D position is selected as the at least one first 1-D position. As another example, the number of sensors closest to each fourth 1-D position and the number of sensors closest to each fifth 1-D position are compared, the one which has greater number of closest sensors is used as the at least one first 1-D position. If both are the same, then one of the at least one fourth 1-D position or the at least one fifth 1-D position is selected as the at least one first 1-D position. Accordingly, a more accurate axis is first determined by self-capacitance detection, such as the axis with more positions or corresponds to more sensors.

In other words, the more accurate axis in the two axes is first determined by self-capacitance detection, such as the axis with more analyzed positions or more touch-related sensors. Then, mutual-capacitance detection is performed on the more accurate axis. For example, a 1-D position of a first axis and a 1-D position of a second axis are determined by said self-capacitance detection, and the one with greater number of positions or greater number of closest sensors is used as the more accurate axis. Sensors on the more accurate axis are used as said plurality of first sensors. In fact, during determining of the more accurate axis, determining at least one first 1-D position corresponding to at least one external touch based on signals of these first sensors by self-capacitance detection described in step 720 is completed. Next, according to those described in steps 730 to 750, at least one 2-D position is provided.

Figure 7C:
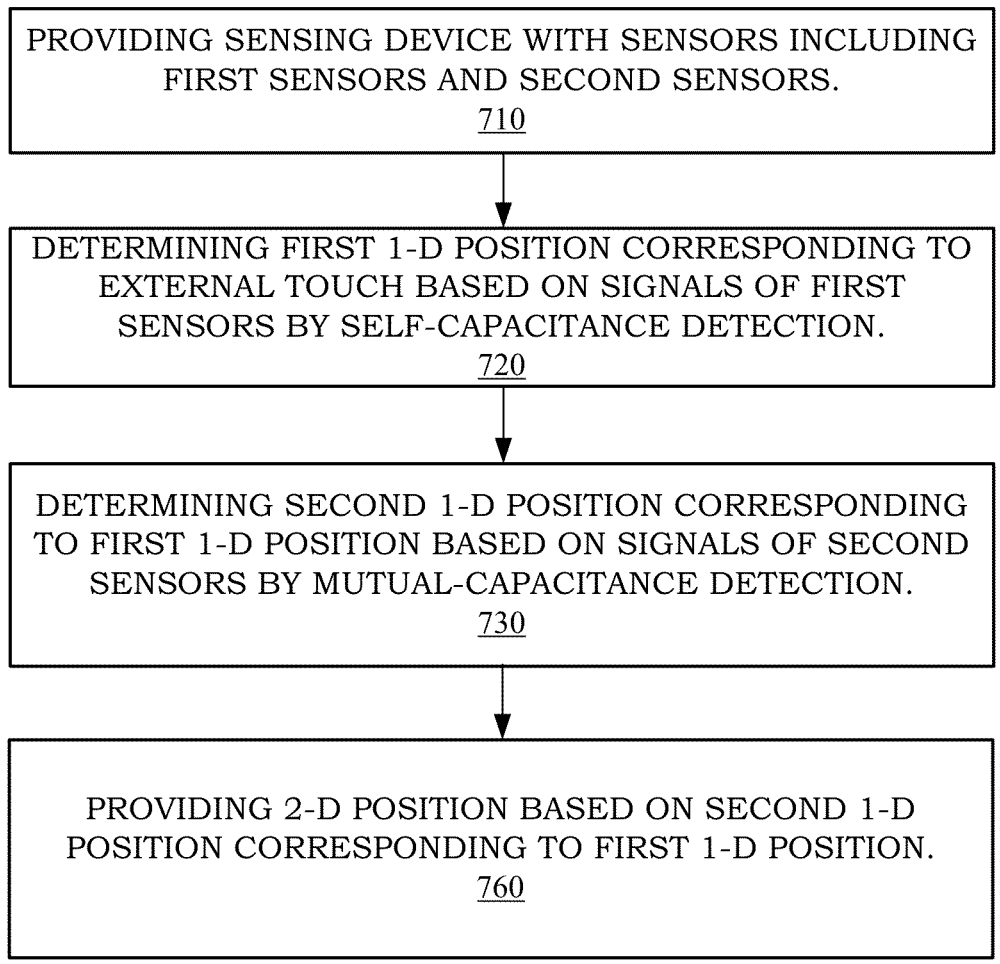

Referring to FIG. 7C, in a second example of the present invention, after steps 720 and 730, at least one 2-D position is provided based on the at least one second 1-D position corresponding to the at least one first 1-D position, as shown in step 760. For example, after determining a more accurate axis by self-capacitance detection in step 720, steps 730 to 760 are performed to obtain at least one 2-D position.

Figure 7D:
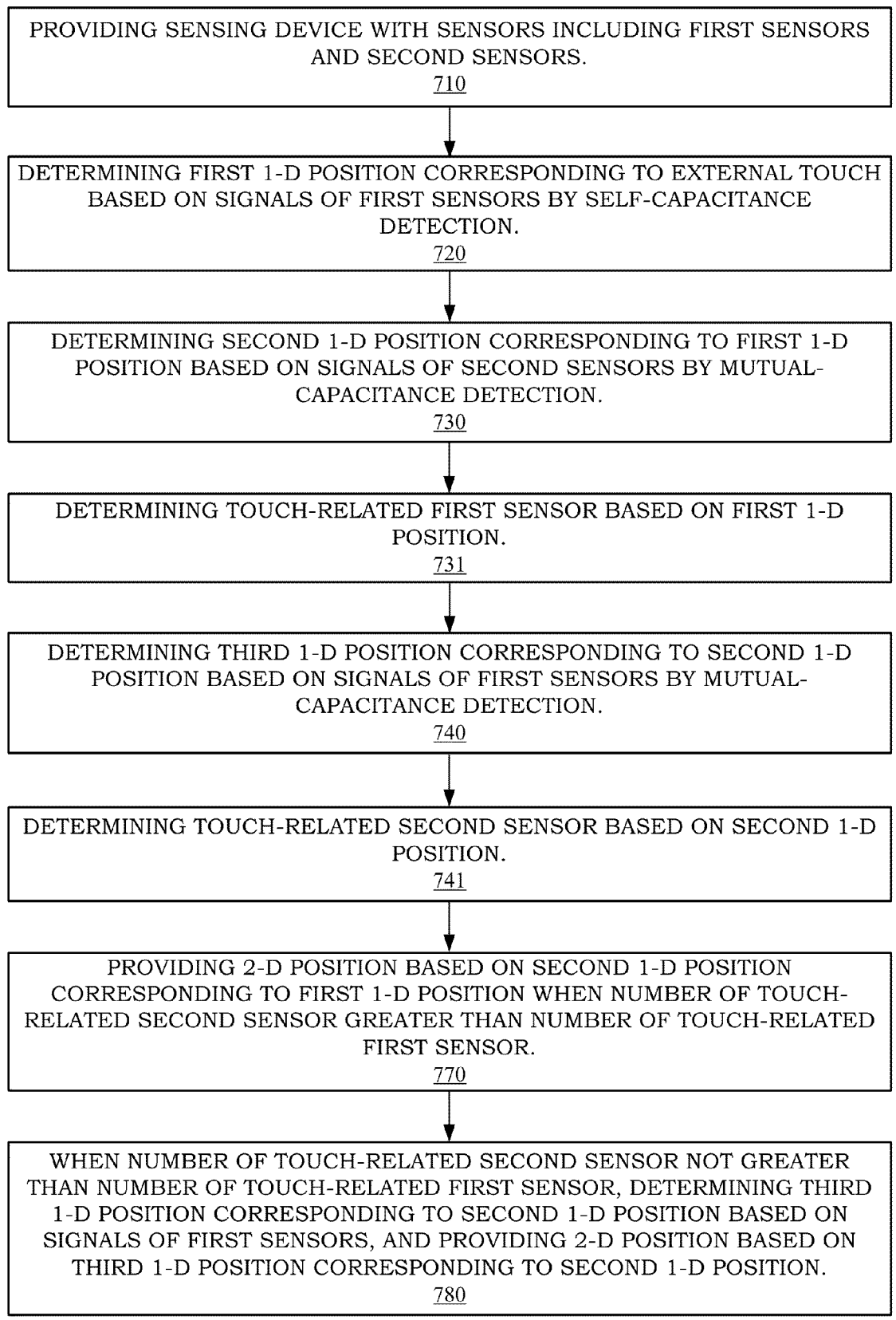

Referring to FIG. 7D, in a third example of the present invention, steps 731 and 741 are further provided, in which at least a touch-related first sensor is determined based on the at least one first 1-D position, and at least a touch-related second sensor is determined based on the at least one second 1-D position. Then, in step 770, when the number of the at least one touch-related second sensor is greater than the number of the at least one touch-related first sensor, at least one 2-D position is provided based on the at least one second 1-D position corresponding to the at least one first 1-D position. Alternatively, in step 780, when the number of the at least one touch-related second sensor is not greater than the number of the at least one touch-related first sensor, at least one third 1-D position corresponding to the at least one second 1-D position is determined based on signals of the first sensors by mutual-capacitance detection, and then at least one 2-D position is provided based on the at least one third 1-D position corresponding to the at least one second 1-D position.

Operations described with respect to FIGS. 7A to 7D can be controlled by controller 160, or controller 160 can provide sensing information to host 170, and host 170 control controller 160 to obtain sensing information and perform relevant operations. In an example of the present invention, sensing information is provided based on the signal variations of the sensors. For example, a non-touched sensing information is recorded when the touch panel is untouched, and whenever self-capacitance detection or mutual-capacitance detection is performed, sensing information generated by signals of the sensors is compared to the non-touched sensing information, and sensing information for position detection is then generated accordingly.

Figure 8A:
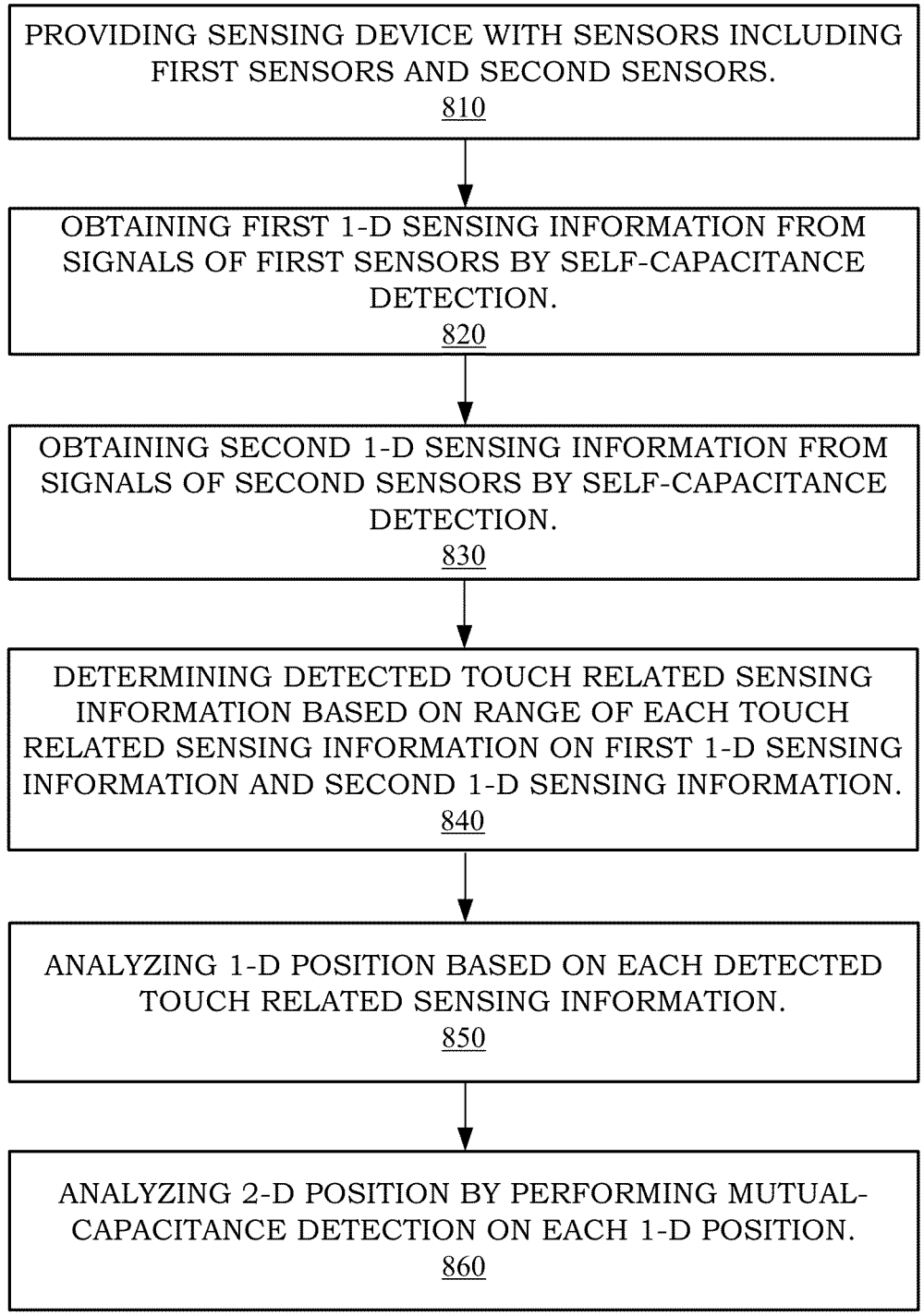
FIGS. 8A to 8C are flowcharts according to a second embodiment of the present invention.

Referring to FIG. 8A, a method for position detection that neglects wide-area touch is provided according to a second embodiment of the present invention. First, in step 810, a sensing device with a plurality of sensors is provided. These sensors include a plurality of first sensors and a plurality of second sensors intersecting each other at a plurality of intersecting points. Then, in steps 820 and 830, at least a first 1-D sensing information is obtained from signals of the first sensors by self-capacitance detection, and at least a second 1-D sensing information is obtained from signals of the second sensors by self-capacitance detection. Thereafter, in step 840, a detected touch related sensing information is determined based on the range of each touch related sensing information on the first 1-D sensing information and the second 1-D sensing information, wherein each touch related sensing information corresponds to a touch or approach by at least one external object. Then, in step 850, at least one 1-D position is analyzed based on each detected touch related sensing information, and in step 860, at least a 2-D position is analyzed by performing mutual-capacitance detection on each 1-D position.

In steps 820 and 830, self-capacitance detection may include providing a driving signal to the first sensors, and detecting variations in capactively coupled signals between the first sensors and at least one external object, in order to obtain the first 1-D sensing information. Similarly, a driving signal can be provided to the second sensors, and variations in capactively coupled signals between the second sensors and at least one external object are detected to obtain the second 1-D sensing information.

In step 840, the detected touch related sensing information can be determined by a threshold. For example, the range of the detected touch related sensing information is smaller than a threshold, thus, touch related sensing information corresponding to wide-area touches can be neglected.

Referring to FIG. 6C, on the horizontal axis, a touch related sensing information corresponding to wide-area touch H is bounded by left boundary L and right boundary R. When the range bounded by left boundary L and right boundary R is not smaller than a threshold, the touch related sensing information corresponding to wide-area touch H will be neglected. In other words, touches made by pens or fingers can be detected, for example, a touch related sensing information corresponding to small-area touch F can be determined as the detected touch related sensing information. Similarly, on the vertical axis, a touch related sensing information with large area is superimposed by the touch related sensing information corresponding to small-area touch F and the touch related sensing information corresponding to wide-area touch H, when this superimposed large-area touch related sensing information is greater than the threshold, it will be neglected. In this example, there is no detected touch related sensing information on the vertical axis, and there is a detected touch related sensing information corresponding to small area F on the horizontal axis.

When inputting on the sensing device using a pen held by fingers, there will be a distance between the fingers and the palm. Under most circumstances, the small-area touch of the pen and the wide-area touch of the palm will only superimpose on one axis. In other words, by neglecting wide-area touches on two axes, a detected touch related sensing information of a small-touch area can be detected on the more accurate axis. Using this characteristic, palm rejection can be achieved, and only pen touches are detected, or the trace of the pen or a hand gesture can be further determined.

Figure 8B:
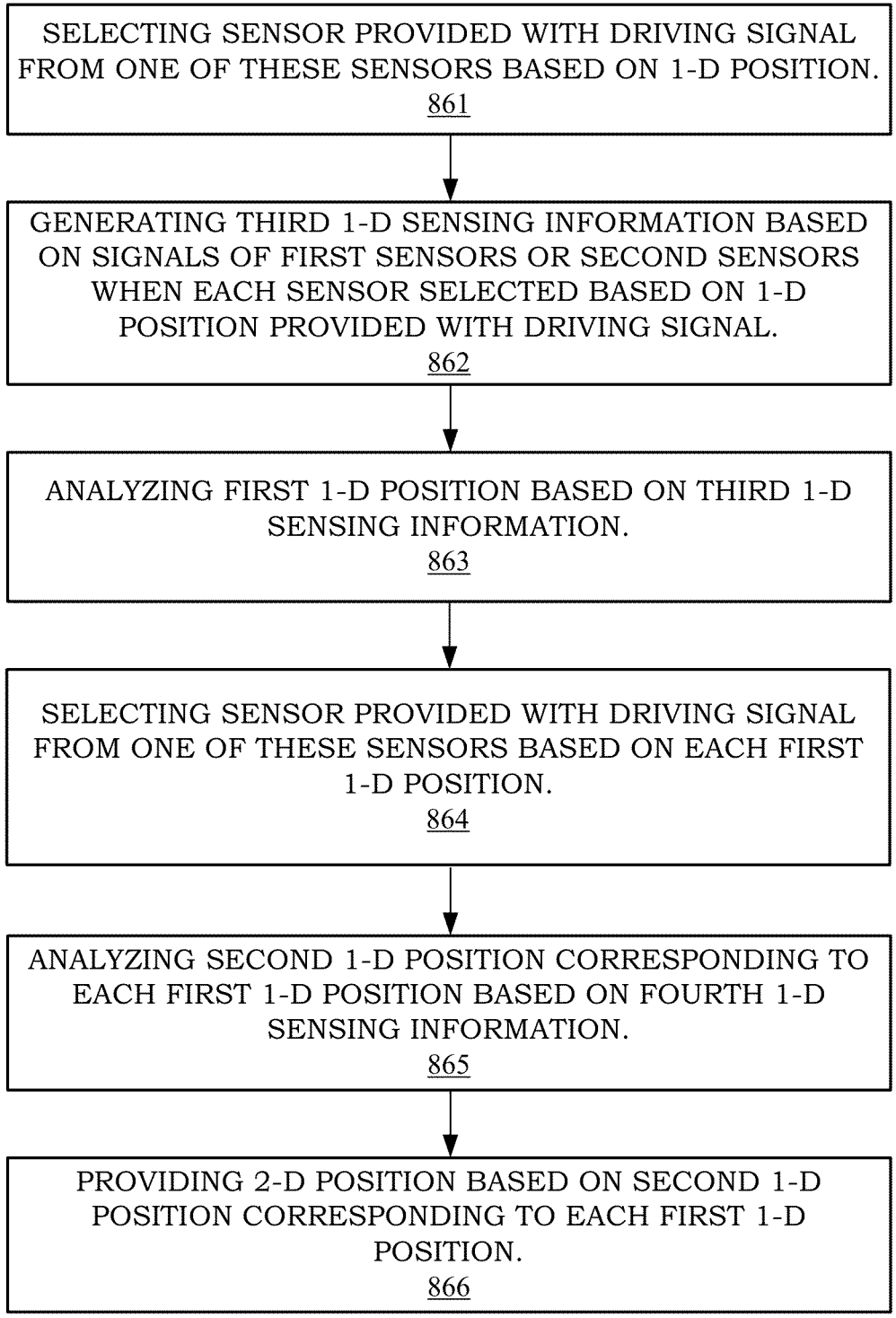

The mutual-capacitance detection in step 860 can be as shown in FIG. 8B. First, in step 861, a sensor provided with the driving signal is selected based on the at least one 1-D position. Then, in step 862, when each sensor selected based on the 1-D position is provided with the driving signal, a third 1-D sensing information is generated based on signals of the first sensors or the second sensors. Then, in step 863, at least a first 1-D position is analyzed based on the third 1-D sensing information, and in step 864, a sensor provided with the driving signal is selected based on each first 1-D position. Next, in step 865, at least a second 1-D position corresponding to each first 1-D position is analyzed based on a fourth 1-D sensing information, and in step 866, at least a 2-D position is provided based on the at least one second 1-D position corresponding to each first 1-D position.

In FIG. 8B, when a 1-D position or a first 1-D position is analyzed from the touch related sensing information of the first 1-D sensing information, the sensor provided with the driving signal is the first sensor closest to the 1-D position, and when a 1-D position or a first 1-D position is analyzed from the touch related sensing information of the second 1-D sensing information, the sensor provided with the driving signal is the second sensor closest to the 1-D position.

Figure 8C:
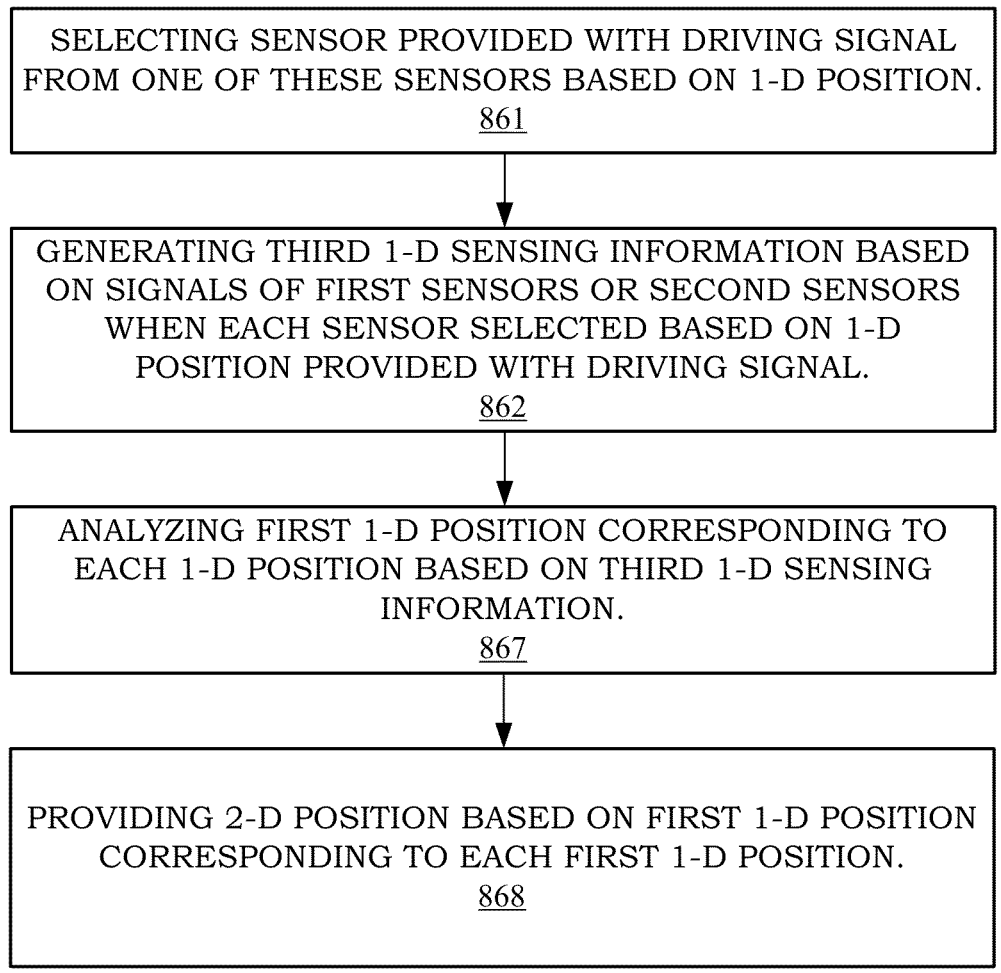

Furthermore, the mutual-capacitance detection in step 860 can be as shown in FIG. 8C, First, in step 861, a sensor provided with the driving signal is selected based on the at least one 1-D position. Then, in step 862, when each sensor selected based on the 1-D position is provided with the driving signal, a third 1-D sensing information is generated based on signals of the first sensors or the second sensors. Then, in step 867, at least a first 1-D position corresponding to each 1-D position is analyzed based on the third 1-D sensing information. Next, in step 868, at least a 2-D position is provided based on the at least one first 1-D position corresponding to each 1-D position.

For example, referring back to FIG. 6C, a 1-D position X can be determined from the detected touch related sensing information on the horizontal axis, and a first sensor closest to position X is further selected. By providing a driving signal to the selected first sensor for mutual-capacitance detection, a third 1-D sensing information is generated based on signals of the second sensors, and a first 1-D position Y is determined based on the third 1-D sensing information. Accordingly, the 2-D position (X,Y) of small-area touch F is determined based on the 1-D position X and the first 1-D position Y.

In addition, a closest second sensor can be selected based on the first 1-D position Y. By providing a driving signal to the selected second sensor for mutual-capacitance detection, a fourth 1-D sensing information is generated based on signals of the first sensors, and a second 1-D position X' (not shown) is determined based on the fourth 1-D sensing information. Accordingly, the 2-D position (X',Y) of small-area touch F is determined based on the first 1-D position Y and the second 1-D position X'.

Operations described with respect to FIGS. 8A to 8C can be controlled by controller 160, or controller 160 can provide sensing information to host 170, and host 170 control controller 160 to obtain sensing information and perform relevant operations. In an example of the present invention, sensing information is provided based on the signal variations of the sensors. For example, a non-touched sensing information is recorded when the touch panel is untouched, and whenever self-capacitance detection or mutual-capacitance detection is performed, sensing information generated by signals of the sensors is compared to the non-touched sensing information, and sensing information for position detection is then generated accordingly.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A method for position detection that neglects wide-area touches, comprising:
providing a sensing device including a plurality of sensors including a plurality of first sensors and a plurality of second sensors, these first and second sensors intersecting each other at a plurality of intersecting points;
obtaining a first 1-D sensing information from signals of the first sensors by self-capacitance detection;
obtaining a second 1-D sensing information from signals of the second sensors by self-capacitance detection;
determining a detected touch related sensing information based on the range of each touch related sensing information on the first 1-D sensing information and the second 1-D sensing information, wherein each touch related sensing information corresponds to a touch or approach by at least one external object;
analyzing at least one 1-D position based on each detected touch related sensing information; and
analyzing at least one 2-D position by performing mutual-capacitance detection on each 1-D position.

2. The method of claim 1, wherein the self-capacitance detection includes:
providing a driving signal to these first sensors, and detecting variations in capactively coupled signals between these first sensor and the at least one external object to obtain the first 1-D sensing information; and
providing a driving signal to these second sensors, and detecting variations in capactively coupled signals between these second sensor and the at least one external object to obtain the second 1-D sensing information.

3. The method of claim 1, wherein the mutual-capacitance detection includes:
providing a driving signal to one of these first sensors as a first single source, and detecting variations in capactively coupled signals between the first signal source, these first 1-D sensors and the at least one external object using these second sensors.

4. The method of claim 3, wherein the mutual-capacitance detection further includes:
selecting a sensor provided with the driving signal from one of these sensors based on the at least one 1-D position;
generating a third 1-D sensing information based on signals of these first sensors or the second sensors when each sensor selected based on the 1-D position is provided with the driving signal;
analyzing at least one first 1-D position corresponding to each 1-D position based on the third 1-D sensing information; and
providing at least one 2-D position based on the at least one first 1-D position corresponding to each 1-D position.

5. The method of claim 4, wherein when the 1-D position is analyzed from the touch related sensing information of the first 1-D sensing information, the sensor provided with the driving signal is the first sensor closest to the 1-D position, and when the 1-D position is analyzed from the touch related sensing information of the second 1-D sensing information, the sensor provided with the driving signal is the second sensor closest to the 1-D position.

6. The method of claim 3, wherein when the 1-D position or the first 1-D position is analyzed from the touch related sensing information of the first 1-D sensing information, the sensor provided with the driving signal is the first sensor closest to the 1-D position, and when the 1-D position or the first 1-D position is analyzed from the touch related sensing information of the second 1-D sensing information, the sensor provided with the driving signal is the second sensor closest to the 1-D position.

7. The method of claim 1, wherein the range of the detected touch related sensing information is smaller than a threshold.

8. The method of claim 1, wherein the first 1-D sensing information and the second 1-D sensing information including a plurality of differences, wherein each difference is generated based on a pair of sensors among these sensors.

9. A device for position detection that neglects wide-area touches, comprising:
   a sensing device including a plurality of sensors including a plurality of first sensors and a plurality of second sensors, these first and second sensors intersecting each other at a plurality of intersecting points; and
   a controller for performing at least the following operations:
   obtaining a first 1-D sensing information from signals of the first sensors by self-capacitance detection;
   obtaining a second 1-D sensing information from signals of the second sensors by self-capacitance detection;
   determining a detected touch related sensing information based on the range of each touch related sensing information on the first 1-D sensing information and the second 1-D sensing information, wherein each touch related sensing information corresponds to a touch or approach by at least one external object;
   analyzing at least one 1-D position based on each detected touch related sensing information; and
   analyzing at least one 2-D position by performing mutual-capacitance detection on each 1-D position.

10. The device of claim 9, wherein the self-capacitance detection includes:
    providing a driving signal to these first sensors, and detecting variations in capactively coupled signals between these first sensor and the at least one external object to obtain the first 1-D sensing information; and
    providing a driving signal to these second sensors, and detecting variations in capactively coupled signals between these second sensor and the at least one external object to obtain the second 1-D sensing information.

11. The device of claim 9, wherein the mutual-capacitance detection includes:
    providing a driving signal to one of these first sensors as a first single source, and detecting variations in capactively coupled signals between the first signal source, these first 1-D sensors and the at least one external object using these second sensors.

12. The device of claim 11, wherein the mutual-capacitance detection further includes:
    selecting a sensor provided with the driving signal from one of these sensors based on the at least one 1-D position;
    generating a third 1-D sensing information based on signals of these first sensors or the second sensors when each sensor selected based on the 1-D position is provided with the driving signal;
    analyzing at least one first 1-D position corresponding to each 1-D position based on the third 1-D sensing information; and
    providing at least one 2-D position based on the at least one first 1-D position corresponding to each 1-D position.

13. The device of claim 12, wherein when the 1-D position is analyzed from the touch related sensing information of the first 1-D sensing information, the sensor provided with the driving signal is the first sensor closest to the 1-D position, and when the 1-D position is analyzed from the touch related sensing information of the second 1-D sensing information, the sensor provided with the driving signal is the second sensor closest to the 1-D position.

14. The device of claim 11, wherein when the 1-D position or the first 1-D position is analyzed from the touch related sensing information of the first 1-D sensing information, the sensor provided with the driving signal is the first sensor closest to the 1-D position, and when the 1-D position or the first 1-D position is analyzed from the touch related sensing information of the second 1-D sensing information, the sensor provided with the driving signal is the second sensor closest to the 1-D position.

15. The device of claim 9, wherein the range of the detected touch related sensing information is smaller than a threshold.

16. The device of claim 9, wherein the first 1-D sensing information and the second 1-D sensing information including a plurality of differences, wherein each difference is generated based on a pair of sensors among these sensors.

* * * * *